(12) United States Patent
Zhou et al.

(10) Patent No.: US 11,602,087 B2
(45) Date of Patent: Mar. 7, 2023

(54) DOUBLE-SIDED HYBRID COOLING OF PCB EMBEDDED POWER ELECTRONICS AND CAPACITORS

(71) Applicants: Toyota Motor Engineering & Manufacturing North America, Inc., Plano, TX (US); Toyota Jidosha Kabushiki Kaisha, Toyota Aichi-ken (JP)

(72) Inventors: Feng Zhou, Ann Arbor, MI (US); Shohei Nagai, Aichi (JP); Shailesh N. Joshi, Ann Arbor, MI (US); Hitoshi Fujioka, Ann Arbor, MI (US); Danny J. Lohan, Ann Arbor, MI (US); Hiroshi Ukegawa, South Lyon, MI (US); Ercan Mehmet Dede, Ann Arbor, MI (US)

(73) Assignees: TOYOTA JIDOSHA KABUSHIKI KAISHA, Aichi-Ken (JP); TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 66 days.

(21) Appl. No.: 17/165,602

(22) Filed: Feb. 2, 2021

(65) Prior Publication Data
US 2022/0142017 A1 May 5, 2022

Related U.S. Application Data

(60) Provisional application No. 63/107,702, filed on Oct. 30, 2020.

(51) Int. Cl.
*H05K 7/20* (2006.01)

(52) U.S. Cl.
CPC ..... *H05K 7/20936* (2013.01); *H05K 7/20254* (2013.01); *H05K 7/20318* (2013.01);
(Continued)

(58) Field of Classification Search
CPC ........... H05K 7/20254; H05K 7/20309; H05K 7/20336; H05K 7/20509; H05K 7/20872–20881; H05K 7/20927–20936
See application file for complete search history.

(56) References Cited

U.S. PATENT DOCUMENTS 6,466,441 B1 10/2002 Suzuki
6,819,561 B2 * 11/2004 Hartzell ................. F28F 1/045
361/689

(Continued)

FOREIGN PATENT DOCUMENTS

EP 3177125 B1 12/2019
WO 2014133394 A1 9/2014

*Primary Examiner* — Robert J Hoffberg
(74) *Attorney, Agent, or Firm* — Dinsmore & Shohl LLP

(57) ABSTRACT

A cold plate includes a first cooling surface comprising a first cooling structure bonded to an inner surface of the first cooling surface, a second cooling surface comprising a second cooling structure bonded to an inner surface of the second cooling surface, a manifold comprising an internal cavity defined by a first length, a first width, and a first height, and a flow divider defined by a second length, a second width, and a second height. The manifold is enclosed by the first cooling surface and the second cooling surface on opposing surfaces of the manifold separated by the first height. The flow divider is positioned within the internal cavity of the manifold. The flow divider supports and separates the first cooling structure and the second cooling structure by a portion of the second height of the flow divider.

20 Claims, 19 Drawing Sheets

(52) U.S. Cl.
CPC ..... *H05K 7/20327* (2013.01); *H05K 7/20336*
(2013.01); *H05K 7/20509* (2013.01); ***H05K
7/20927*** (2013.01)

(56) References Cited

U.S. PATENT DOCUMENTS

| | | | | |
|---|---|---|---|---|
| 6,990,816 B1* | 1/2006 | Zuo | ................... | F28D 15/046 |
| | | | | 62/79 |
| 7,173,823 B1* | 2/2007 | Rinehart | ............... | F28F 21/065 |
| | | | | 165/80.4 |
| 7,353,859 B2 | 4/2008 | Dragoljub et al. | | |
| 8,199,505 B2* | 6/2012 | Dede | ................... | H01L 23/4735 |
| | | | | 165/185 |
| 8,243,451 B2* | 8/2012 | Dede | ....................... | F28F 13/08 |
| | | | | 361/689 |
| 8,427,832 B2* | 4/2013 | Dede | .................... | F28F 9/0221 |
| | | | | 361/717 |
| 9,003,649 B1* | 4/2015 | Romero | ................. | F28F 3/022 |
| | | | | 29/830 |
| 9,445,526 B2* | 9/2016 | Zhou | ................... | H05K 7/20272 |
| 9,531,247 B2 | 12/2016 | Kuznetsov | | |
| 9,693,487 B2* | 6/2017 | Choi | ................... | H05K 7/20927 |
| 9,795,057 B2* | 10/2017 | Reeves | ............... | H05K 7/20927 |
| 9,980,415 B2* | 5/2018 | Zhou | ................... | H05K 7/20927 |
| 10,410,955 B2* | 9/2019 | Tsai | ....................... | F28D 15/00 |
| 10,531,594 B2* | 1/2020 | Reeves | ................. | H01L 23/473 |
| 11,239,137 B1* | 2/2022 | Zhou | ................... | H01L 21/4882 |
| 2004/0218367 A1* | 11/2004 | Lin | ..................... | H05K 7/20509 |
| | | | | 361/720 |
| 2014/0060780 A1* | 3/2014 | Moon | ................. | F28D 15/0233 |
| | | | | 29/890.032 |
| 2014/0190665 A1 | 7/2014 | Joshi et al. | | |
| 2016/0223264 A9 | 8/2016 | Sampath et al. | | |
| 2019/0239395 A1 | 8/2019 | Joshi et al. | | |
| 2022/0015271 A1* | 1/2022 | De Sousa | .......... | H05K 7/20927 |
| 2022/0065549 A1* | 3/2022 | Zhou | ....................... | F28D 15/02 |
| 2022/0142013 A1* | 5/2022 | Zhou | ........................ | F28F 3/12 |
| | | | | 361/702 |

* cited by examiner

DOUBLE-SIDED HYBRID COOLING OF PCB EMBEDDED POWER ELECTRONICS AND CAPACITORS

CROSS-REFERENCE TO RELATED APPLICATIONS

This application claims the benefit of U.S. Provisional Application No. 63/107,702, entitled "DOUBLE-SIDED HYBRID COOLING OF PCB EMBEDDED POWER ELECTRONICS AND CAPACITORS," filed Oct. 30, 2020, the entirety of which is hereby incorporated by reference.

TECHNICAL FIELD

The present specification generally relates to cold plates, and more specifically to hybrid cold plates for use with electronic systems.

BACKGROUND

Power control units (PCUs) include power cards having power devices, cooling device(s), gate drivers, printed circuit board(s) (PCBs), capacitors, and other components. A component of the PCU is a power card, which contains power devices that may be switched on and off in high frequency during operation of a vehicle, for example. These power devices may generate significant amounts of heat. Conventional power cards have designs for exposing surface area of the power devices for cooling purposes. Some PCUs include power cards that are sandwiched within liquid cooled units to maintain a proper temperature while they are switching on and off, because switching generates heat. Furthermore, the power cards are connected to the driver board through pin connections. Such power cards may be mounted to a driver board via pins and may extend a distance from the driver board, leading to a larger volume profile, which includes a small power density and a high system loop inductance, resulting in a high power loss, especially at high switching frequencies. PCUs may include power device embedded printed circuit boards (PCBs). The power device embedded PCBs may generate high levels of heat, thus requiring efficient cold plates for removing the heat. PCUs may also include lower heat generating devices such as capacitors that may also require a cooling device. To achieve more compact and high energy density power electronic solutions improvements in cold plate designs and utilization for PCUs are desirable.

SUMMARY

In one aspect, a cold plate includes a first cooling surface comprising a first cooling structure bonded to an inner surface of the first cooling surface, a second cooling surface comprising a second cooling structure bonded to an inner surface of the second cooling surface, a manifold comprising an internal cavity defined by a first length, a first width, and a first height, and a flow divider defined by a second length, a second width, and a second height. The manifold is enclosed by the first cooling surface and the second cooling surface on opposing surfaces of the manifold separated by the first height. The flow divider is positioned within the internal cavity of the manifold. The flow divider supports and separates the first cooling structure and the second cooling structure by a portion of the second height of the flow divider.

In some aspects, a power control unit (PCU) includes a power device embedded printed circuit board (PCB) comprising one or more power devices embedded within the power device embedded PCB, and a cold plate coupled to the power device embedded PCB. The cold plate includes a first cooling surface comprising a first cooling structure bonded to an inner surface of the first cooling surface, a second cooling surface comprising a second cooling structure bonded to an inner surface of the second cooling surface, a manifold comprising an internal cavity defined by a first length, a first width, and a first height, and a flow divider defined by a second length, a second width, and a second height. The manifold is enclosed by the first cooling surface and the second cooling surface on opposing surfaces of the manifold separated by the first height. The flow divider is positioned within the internal cavity of the manifold. The flow divider supports and separates the first cooling structure and the second cooling structure by a portion of the second height of the flow divider, where the power device embedded PCB is coupled to the cold plate on an exterior surface of the first cooling surface.

In some aspects, a cooling system includes a fluid reservoir; a pump fluidly coupled to the fluid reservoir, and a cold plate. The cold plate includes a first cooling surface comprising a first cooling structure bonded to an inner surface of the first cooling surface, a second cooling surface comprising a second cooling structure bonded to an inner surface of the second cooling surface, a manifold, and a flow divider defined by a second length, a second width, and a second height. The manifold includes an internal cavity defined by a first length, a first width, and a first height, and an inlet port, a vapor outlet port, and a liquid outlet port extending from an exterior surface of the manifold into the internal cavity. The manifold is enclosed by the first cooling surface and the second cooling surface on opposing surfaces of the manifold separated by the first height. The flow divider is positioned within the internal cavity of the manifold. The flow divider supports and separates the first cooling structure and the second cooling structure by a portion of the second height of the flow divider. The pump is fluidly coupled to the inlet port of the manifold. The liquid outlet port and the vapor outlet port is fluidly coupled to the fluid reservoir.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
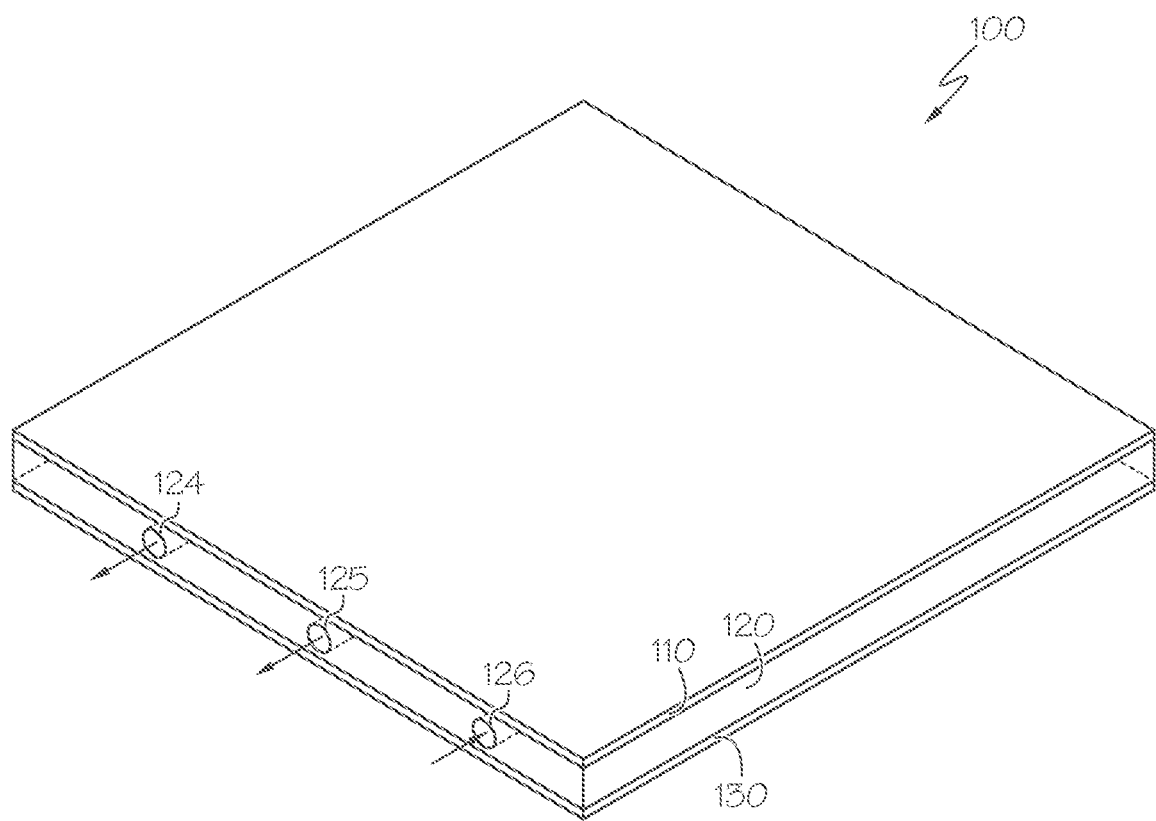
FIG. 1 schematically depicts an illustrative cold plate, according to one or more embodiments shown and described herein.

Embodiments of the present disclosure include hybrid cold plates capable of providing single-phase and/or two-phase cooling structures to electronics of a power control unit. The hybrid cold plates provide the flexibility of tuning its cooling capability on different cooling surfaces depending on the cooling needs for the electronics coupled to the respective cooling surfaces of the hybrid cold plates. That is, each cooling surface of the cold plate can provide different cooling capabilities depending on what is bonded to the exterior surface of the cold plate. In some embodiments, the two-phase cooling structure may be a porous wick structure bonded to the interior surface of the cooling surface coupled on its exterior surface to, for example, a power device embedded PCB. The single-phase cooling structure may be flow channels, also referred to micro-channels, bonded to the interior surface of the cooling surface coupled on its exterior surface to one or more electronic devices such as a capacitor. For example, the single-phase flow through the microchannels provide a continuous liquid supply to the two-phase cooling on the other side as well, which makes the cold plate dual functional.

The single-phase cooling structures and the two-phase cooling structures bonded to their respective cooling surfaces may be positioned adjacent to heat spots to provide customized cooling. For example, the microchannels of the single-phase cooling structure could be separated to cool specified heat spots or be continuous to provide a uniform cooling, or even by tuning the channel width to provide customized cooling depending on the power level of the different heat sources attached to different locations on the same surface. Furthermore, a shape of the microchannels could be customized for different single-phase cooling performance without effecting the two-phase cooling side. The cold plate two-phase cooling side could be used to cool a plurality of power devices of an inverter embedded in the PCB, a converter embedded within the PCB, or other types of power electronics embedded within the PCB. The number of power devices embedded within each PCB may be 1, 2, 3, 4, 5, 6, 7, 8, or more. There may be one or more embedded PCB layers each having one or more power devices. For example, a 6-in-1 structure may refer to a PCU having on embedded power device PCB with 6 power device embedded therein. Similarly, a 12-in-2 structure may refer to a PCU having two embedded power device PCBs separate by a cold plate as described herein where each embedded power device PCB includes 6 power device embedded therein. In some embodiments, as described in more detail herein a PCU may include a layer of capacitors that are thermally coupled to a single-phase cooling side could be used to cool the capacitors, which may generate lower amounts of heat as compared to the embedded power device PCB layers.

The cold plates may be implemented in PCUs and fluidly coupled to cooling systems. The cooling systems provide liquid working fluid to the cold plate and extract heated liquid fluid and/or vapor from the cold plate as a result of the two-phase cooling structure. The cooling systems include a variety of components, for example, without limitation, reservoir(s), vapor condenser(s), condenser(s), pump(s), valve(s), filter(s), motor(s), or the like.

Various configurations of cold plates, power control units, and cooling systems implementing the cold plates are shown and described in detail herein. Turning now to the figures, FIGS. 1-14 depict embodiments of the cold plate and FIGS. 15-19 depict example cooling systems implementing the cold plates.

Turning now to the drawings, wherein like numbers refer to like structures, and particularly to FIG. 1, an illustrative cold plate 100 is depicted. In general, the cold plate 100 includes a first cooling surface 110, a manifold 120, and a second cooling surface 130. The manifold 120 is enclosed by the first cooling surface 110 and the second cooling surface 130 on opposing surfaces of the manifold 120 separated by the thickness of the manifold 120. Additionally, the manifold 120 includes an inlet port 126, a vapor outlet port 125, and a liquid outlet port 124 extending from an exterior surface of the manifold 120 into an internal cavity.

Figure 2:
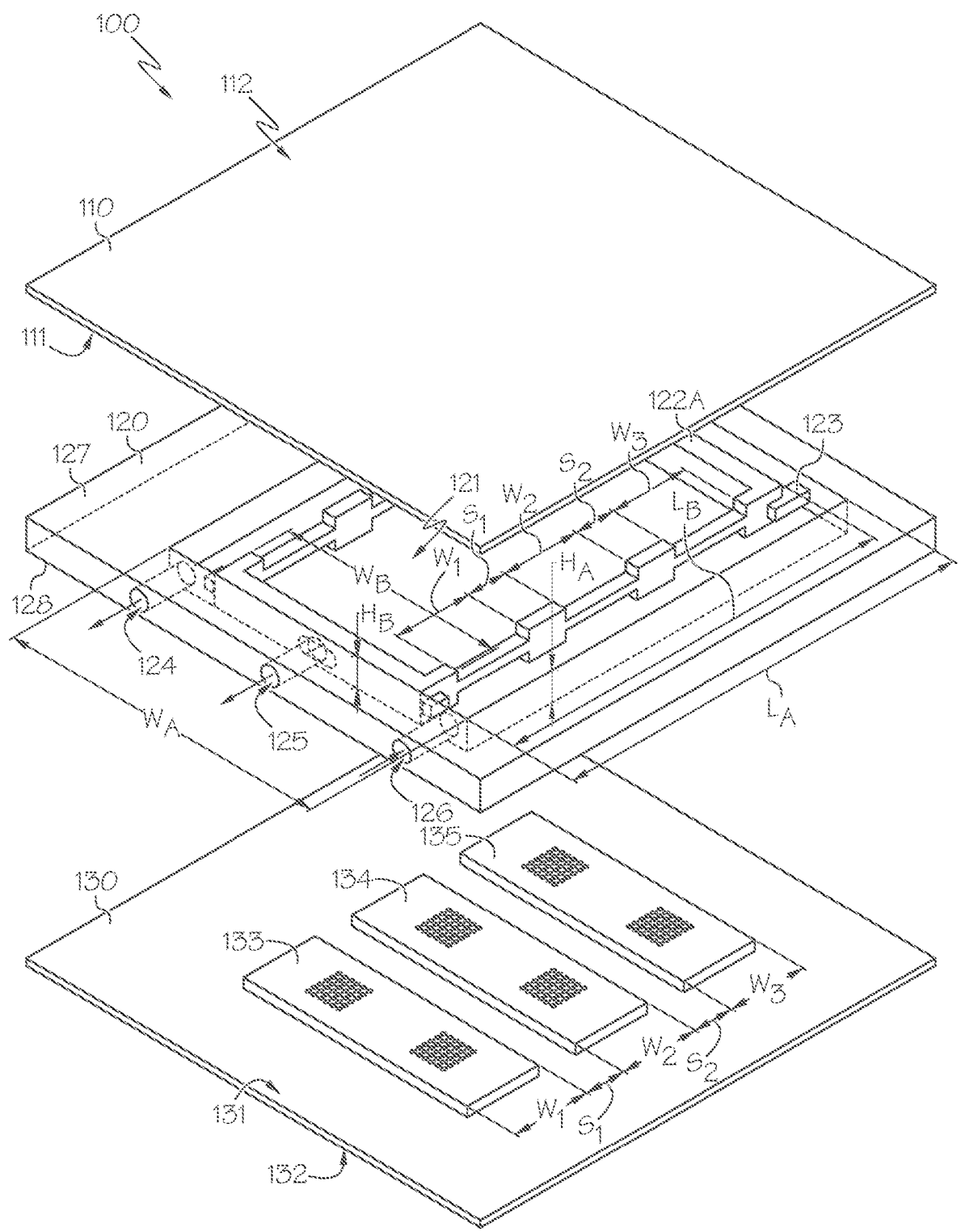
FIG. 2 schematically depicts an exploded view of an illustrative cold plate, according to one or more embodiments shown and described herein.

Referring now to FIG. 2, an exploded view of an illustrative cold plate 100 is depicted. The first cooling surface 110 includes an interior surface 111 opposite an exterior surface 112. The second cooling surface 130 includes an interior surface 131 opposite an exterior surface 132. The manifold 120 includes a top surface 127 opposite a bottom surface 128. The top surface 127 is separated from the bottom surface 128 by a first height $H_A$. The interior surface 111 of the first cooling surface 110 is joined to the top surface 127 of the manifold 120 when the cold plate 100 is assembled. Similarly, the interior surface 131 of the second cooling surface 130 is joined to the bottom surface 128 of the manifold 120 when the cold plate 100 is assembled.

The manifold 120 includes an internal cavity 121 defined by a first length $L_A$, a first width $W_A$, and a first height $H_A$. The internal cavity 121 is further enclosed by the interior surface 111 of the first cooling surface 110 and the interior surface 131 of the second cooling surface 130. The internal cavity 121 includes components that are configured to provide single-phase cooling and/or two-phase cooling. That is, the internal cavity 121 may include a flow divider 122A that is positioned within the internal cavity 121 of the manifold 120.

The flow divider 122A has a frame structure defined by a second length $L_B$, a second width $W_B$, and a second height $H_B$. The first length $L_A$ of the internal cavity 121 is greater than or equal to the second length $L_B$ of the flow divider 122A. As depicted in FIG. 2, the second length $L_B$ of the flow divider 122A is less than the first length $L_A$ of the internal cavity 121. This allows fluid to flow between the flow divider 122A and a rear wall (120C, FIG. 4) of the internal cavity 121, as depicted and described in more detail with reference to FIG. 4. In some embodiments, for example, the flow divider 122B depicted and described with reference to FIG. 8 may have a second length $L_B$ that is equal to the first length $L_A$ of the internal cavity 121 such that fluid flow within the manifold is forced to flow into and through the one or more cooling structures within the internal cavity 121. The first width $W_A$ of the internal cavity 121 is greater than or equal to the second width $W_B$ of the flow divider 122A. Additionally, the first height $H_A$ of the internal cavity 121 is greater than or equal to the second width $W_B$ of the flow divider 122A.

The flow divider 122A provides a structure, which defines one or more flow patterns for liquid and vapor flows within the manifold 120. The flow divider 122A may be positioned and secured to the manifold via one or more flow divider locator structures 123. The flow divider 122A, and similarly the flow divider 122B, described herein below with reference to FIGS. 7-9, support and separate the first cooling structure and the second cooling structure. The flow divider 122A provides a framework that receives the one or more cooling structures such as the first cooling structure (not shown) and the second cooling structure 133, 134, 135 bonded to the first cooling surface 110 and the second cooling surface 130, respectively. The flow divider 122A defines a spacing between the first cooling structure and the second cooling structure that is at least a portion of the second height of the flow divider 122A.

Depending on the cooling application for which the cold plate 100 is needed, single-phase and/or two-phase cooling structures may be bonded to the interior surfaces 111, 131 of the first and second cooling surfaces 110, 130. For example, in the instance where a high degree of cooling is required, such as the cooling of one or more power devices, two-phase cooling structures may be implemented. Two-phase cooling structures may include one or more porous wick structures 133, 134, 135 bonded, for example, to the interior surface 131 of second cooling surface 130. The two-phase cooling structures may be positioned adjacent the one or more power devices (not shown in FIG. 2) that are thermally coupled to the exterior surface 132 of the second cooling surface 130. Accordingly, the heat generated by the one or more power devices causes the liquid fluid infused within the porous wick structures 133, 134, 135 to boil and transform into vapor that escapes the porous wick structures 133, 134, 135, thereby transporting heat from the one or more power devices. The vapor may condense on surfaces within the internal cavity 121 or escape the manifold through a vapor outlet port 125 that fluidly couples the internal cavity 121 to an external environment of the manifold. The external environment, as described in more detail herein, may include a cooling system that is configured to condense the vapor and feed the cooled fluid back into the manifold 120 via an inlet port 126. The manifold 120 also includes a liquid outlet port 124, which provides an exit for fluid fed into the manifold 120 via the inlet port 126 to exit the manifold 120.

In some embodiments, the two-phase cooling structures may be a plurality of porous wick structures 133, 134, 135, as depicted in FIG. 2. The porous wick structures 133, 134, 135 have a predefined width $W_1$, $W_2$, $W_3$. The flow divider 122A may include one or more spacers defining a spacing $S_1$, $S_2$ that separates the plurality of porous wick structures 133, 134, 135 from each other by the predefined spacing $S_1$, $S_2$ along the length of the flow divider 122A.

Figure 3A:
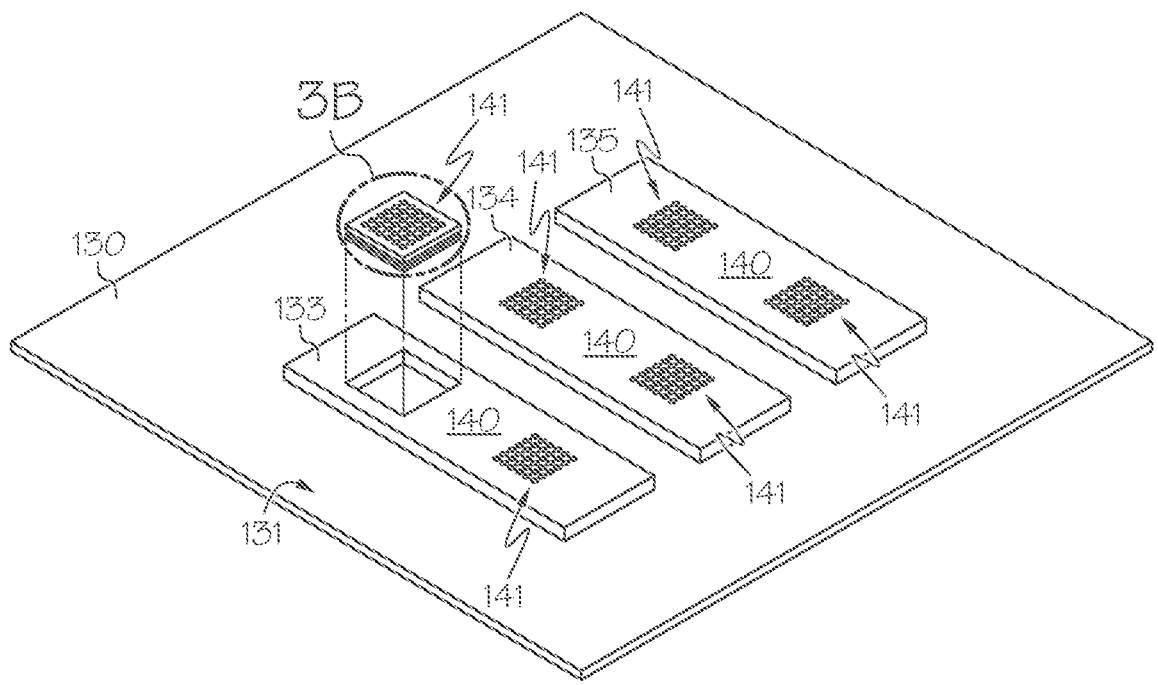
FIG. 3A schematically depicts a cooling surface of an illustrative cold plate having a bulk porous wick structure, according to one or more embodiments shown and described herein.

Turning to FIGS. 3A-3D, example porous wick structures 133, 134, 135 are depicted and described in more detail. FIG. 3A schematically depicts an exploded view of an illustrative cold plate 100 having a plurality of porous wick structures 133, 134, 135. In some embodiments, the second cooling surface 130 (which may also be the first cooling surface) includes two-phase cooling structures in the form of porous wick structures 133, 134, 135. The porous wick structures 133, 134, 135 may include a bulk porous wick structure 140 comprising void spaces within the structure where the voids may contain working fluid. Portions of the bulk porous wick structure 140 may include a multi-layer porous wick structure 141. The multi-layer porous wick structure 141 may be positioned adjacent a hot spot where heat is intended to be removed from such as adjacent a power device.

Figure 3B:
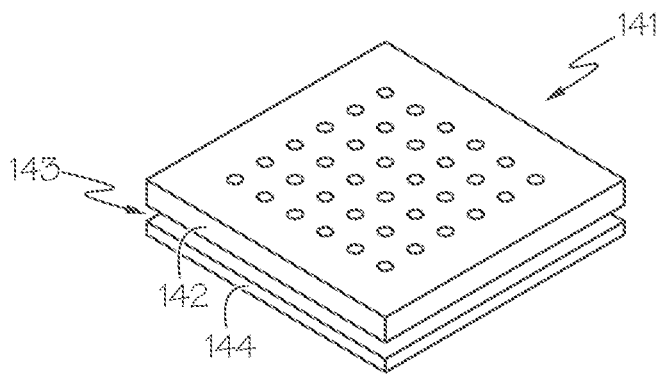
FIG. 3B schematically depicts an isometric view of a multi-layer porous wick structure of a bulk porous wick structure, according to one or more embodiments shown and described herein.
Figure 3C:
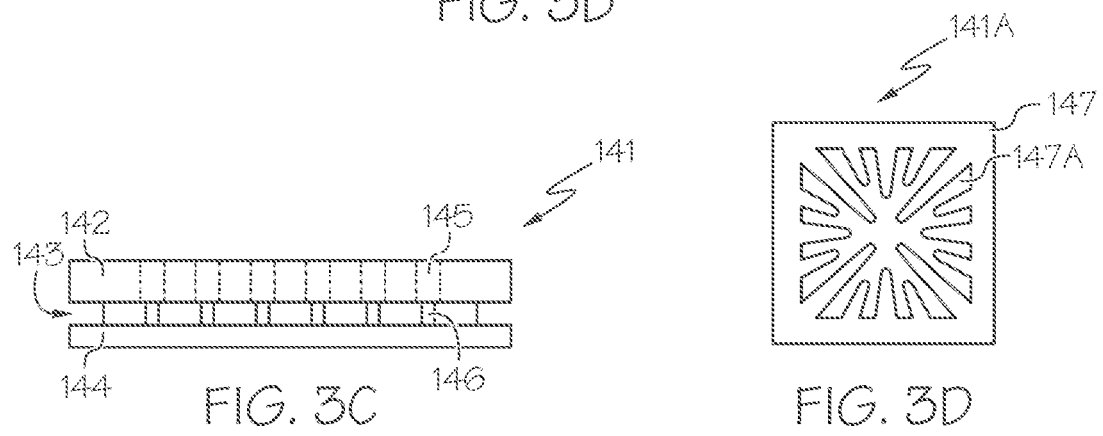
FIG. 3C schematically depicts an side view of the multi-layer porous wick structure of FIG. 3B, according to one or more embodiments shown and described herein.

The multi-layer porous wick structure 141 depicted in FIGS. 3A-3C is a two-layer porous wick structure having a first porous wick layer 144 defining a base wick layer 144 coupled to a second porous wick layer 142 defining a cap wick layer 142 through a plurality of porous liquid supply posts 146 forming interstitial spaces 143 around the plurality of porous liquid supply posts 146 and between the base wick layer 144 and cap wick layer 142. The multi-layer porous wick structure 141 also includes a plurality of through-holes 145 defining vapor vents 145 in the cap wick layer 142. The multi-layer porous wick structure 141 may also include a liquid supply wick (e.g., the bulk porous wick structure 140) coupled to sidewalls of the base wick layer 144 and the sidewalls of the cap wick layer 142. Additionally, the multi-layer porous wick structure 141 may include additional layers (not shown), for example, a third porous wick layer defining a condensing layer coupled to the second porous wick layer 142 defining the cap wick layer 142 through additional porous liquid supply posts 146 forming interstitial spaces around the plurality of porous liquid supply posts 146 and between the condensing layer and cap wick layer 142 thereby defining a vapor core.

The multi-layer porous wick structure 141 may be enclosed within the manifold 120 forming a vapor generating structure that is supplied with working fluid. An appropriate working fluid may be determined based on the operating temperature ranges to effect cooling through the vapor generating structure. As a non-limiting example, the working fluid may be water. The thermophysical properties of water, for example, may be ideal for operating temperatures from room temperature (about 20 degrees Celsius) to about 200 degrees Celsius. While water is used in the following example, it should be understood that other working fluids, such as, for example, but without limitation, water (e.g., deionized water), an alcohol (e.g., ethanol, methanol, propanol, butanol), a ketone (e.g., acetone), a nano-fluid (e.g., colloidal suspensions of nanoparticles and/or metals or metal oxides in base fluids), a refrigerant (e.g., R134a, R600a), a surfactant (e.g., sodium stearate), nitrogen, helium, an ionic liquid, a combination of any of the foregoing, a mixture of any of the foregoing, or the like may be used as a working fluid without departing from the scope of the present disclosure.

As a non-limiting example, during use, the heat generated by a device coupled to a vapor generating structure conducts through the second cooling surface 130 into the base wick layer 144 containing working fluid in the porous structure of the base wick layer 144. The heat from the electronic device causes the working fluid to boil and evaporate from the base wick layer 144 as the temperature increases. The vapor from the boiling working fluid rises from the base wick layer 144 into the interstitial spaces 143 around the plurality of porous liquid supply posts 146 and between the base wick layer 144 and the cap wick layer 142. The vapor further travels through the plurality of through-holes 145 defining vapor vents 145 in the cap wick layer 142. As the vapor travels from the interstitial spaces 143 through the vapor vents 145, the vapor begins to condense. Some vapor may condense on and into the porous structure of the cap wick layer 142. Through capillary action, the condensed working fluid is transported through the cap wick layer 142 and the plurality of porous liquid supply posts 146 back into the base wick layer 144. The capillary action may be sufficient to feed hotspots of the base wick layer 144 with working fluid to continue to promote boiling and evaporation at the hotspots of the base wick layer 144 and prevent dry out of the base wick layer 144. Vapor that does not condense with the cap wick layer 142 may travel through the vapor vents 145 and condenses on other surfaces within the manifold 120 or exits the manifold 120 through the vapor outlet port 125 for condensing and recycling. In addition to the plurality of porous liquid supply posts 146, a liquid supply wick (e.g., the bulk porous wick structure 140) may feed the base wick layer 144 with working fluid. In some embodiments, working fluid is introduced to the liquid supply wick during assembly of the vapor generating structure. In other embodiments, the liquid supply wick may receive working fluid from a reservoir of working fluid or cap wick layers 142 coupled to the liquid supply wick.

Figure 3D:
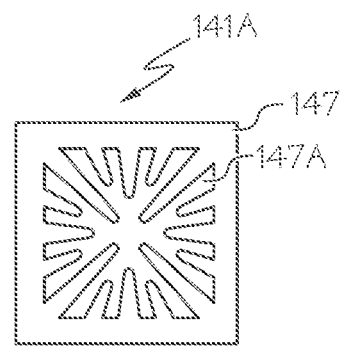
FIG. 3D schematically depicts a another illustrative wick structure optionally implemented within the bulk porous wick structure depicted in FIG. 3A, according to one or more embodiments shown and described herein.

Referring to FIG. 3D, another illustrative wick structure is depicted. In particular, FIG. 3D depicts a top view of a hybrid evaporator wick 141A which may be implemented in place of the multi-layer porous wick structure 141 or in combination with the multi-layer structure 141 in separate positions within the bulk porous wick structure 140. The bottom surface, not shown, which is opposite the first surface 147, may be thermally coupled to the interior surface 131 of the second cooling surface 130. The hybrid evaporator wick 141A includes a first surface 147 and a second surface 147A that is recessed a predefined distance from the first surface 147 into the hybrid evaporator wick 141A. The portions of the hybrid evaporator wick 147A that are not recessed from the first surface 147 define liquid supply structures which collect liquid from the sides (e.g., the bulk porous wick structure 140) and supply it to the second surface 147A which is recessed from the first surface 147. The second surface 147A may define a surface of an evaporator layer (e.g., a layer similar to the base wick layer 144 depicted in FIG. 3C, which is in thermal contact with a device or surface generating for removal by the hybrid evaporator wick 147A cooling. Vapor escaping channels are the void space surrounding the liquid supply structures between the second surface 147A and the first surface 147. The vapor escaping channels provide void space where vapor generated through evaporation can escape the second surface 147A.

The liquid supply structures depicted in FIG. 3D are converging lateral finger-like arteries. However, it should be understood that hybrid wicks can incorporate different liquid supply structures such as an array of vertical columnar arteries (e.g., similar to the liquid supply posts 146 depicted in FIG. 3C. Other liquid supply structures may include a bi-porous structure or other structures.

Figure 4:
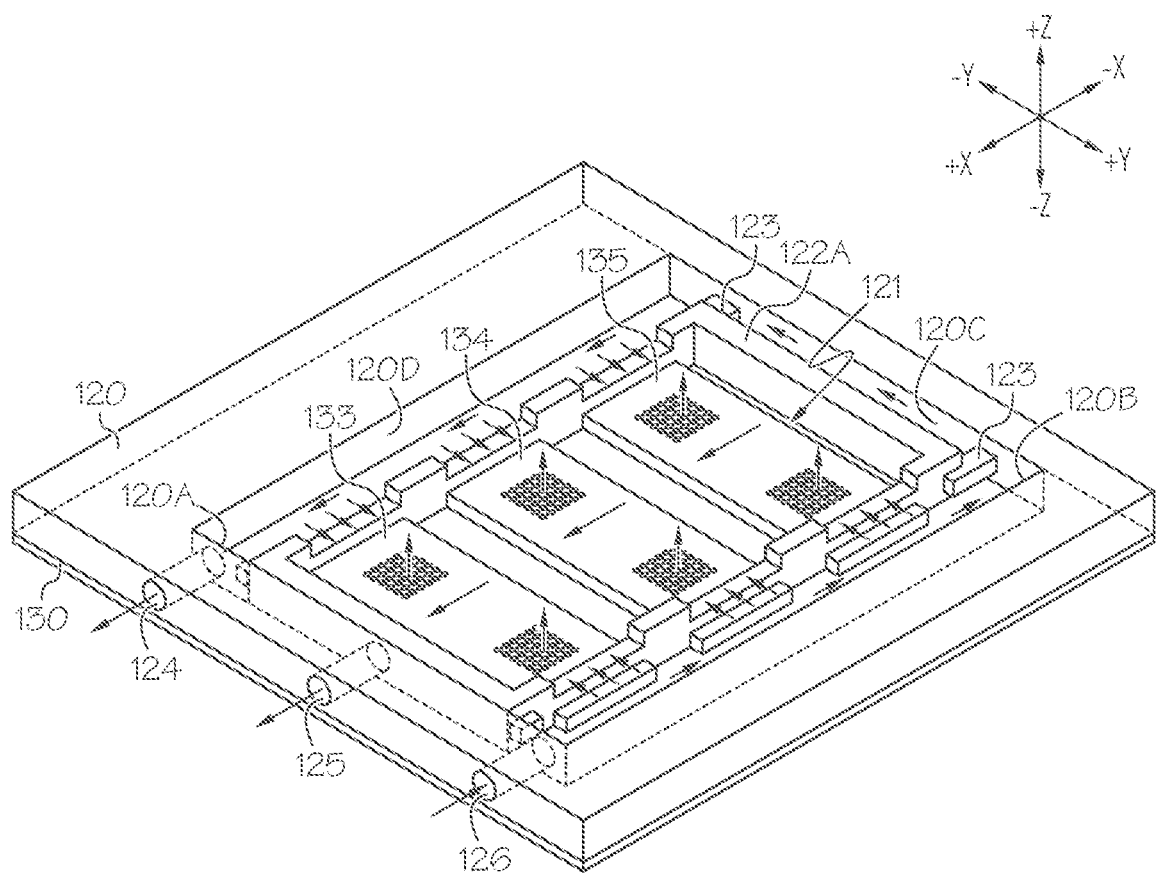
FIG. 4 schematically depicts an internal view of an illustrative cold plate and an illustrative flow of working fluid within the manifold of the cold plate having a flow divider installed, according to one or more embodiments shown and described herein.

Turning now to FIG. 4, an illustrative cold plate 100 and an illustrative flow of working fluid within the manifold 120 of the cold plate 100 is depicted. The arrows annotated in FIG. 4 illustrate flow paths and directions for either liquid or vapor. It is noted that the first cooling surface 110 is not depicted in FIG. 4 for visualization of the flow paths within the internal cavity 121 of the manifold 120. The internal cavity 121 may be defined by a front wall 120A extending along the first width $W_A$ opposite a rear wall 120C also extending along the first width $W_A$. The front wall 120A and the rear wall 120C are spaced apart from each other by a pair of sidewalls 120B, 120D extending along the first length $L_A$ of the internal cavity 121.

Working fluid may enter the internal cavity 121 of the manifold 120 through the inlet port 126. As the fluid enters the internal cavity a portion of the fluid may be absorbed and flow through the porous wick structures 133, 134, 135 (e.g., as indicated by the arrows oriented in the −Y direction of the coordinate axes of FIG. 4). The portion of the fluid that does not enter the porous wick structures 133, 134, 135 will flow within the space defined by the sidewall 120B and the flow divider 122A along the first length $L_A$ of the internal cavity 121. The fluid may further flow into the first cooling structures associated with the first cooling surface (not shown). Once the fluid reaches the rear wall 120C (e.g., while flowing in the −X direction of the coordinate axes of FIG. 4), the fluid may flow around the corner of the flow divider 122A in the space defined by the rear wall 120C and the flow divider 122A along the first width $W_A$ of the internal cavity 121 (e.g., in the −Y direction of the coordinate axes of FIG. 4). The fluid flow is further directed within the space defined by the sidewall 120D and the flow divider 122A along the first length $L_A$ of the internal cavity 121 (e.g., in the +X direction of the coordinate axes of FIG. 4). Similar to the flow pattern along the sidewall 120B, the fluid flowing along the space defined by the sidewall 120D and the flow divider 122A along the first length $L_A$ of the internal cavity 121 may flow into the porous wick structures 133, 134, 135 coupled to the second cooling surface 130 and the first cooling structures associated with the first cooling surface (not shown). Furthermore, the fluid that reaches the front wall 120A flowing along the space defined by the sidewall 120D and the flow divider 122A along the first length $L_A$ of the internal cavity 121 flow out the liquid outlet port 124. As described in more detail herein, the liquid outlet port 124 may be fluidly coupled to cooling system components where the fluid is cooled, filtered, and optionally, recycled into the inlet port 126.

In embodiments having two-phase cooling structures such as porous wick structures 133, 134, 135, the liquid and/or vapor within the internal space defined by the flow divider 122A and the first and second cooling surfaces and their respective cooling structures may exit the manifold via a vapor outlet port 125 which fluidly couples the exterior of the manifold with the internal space of the flow divider 122A and the first and second cooling surfaces.

Figure 5:
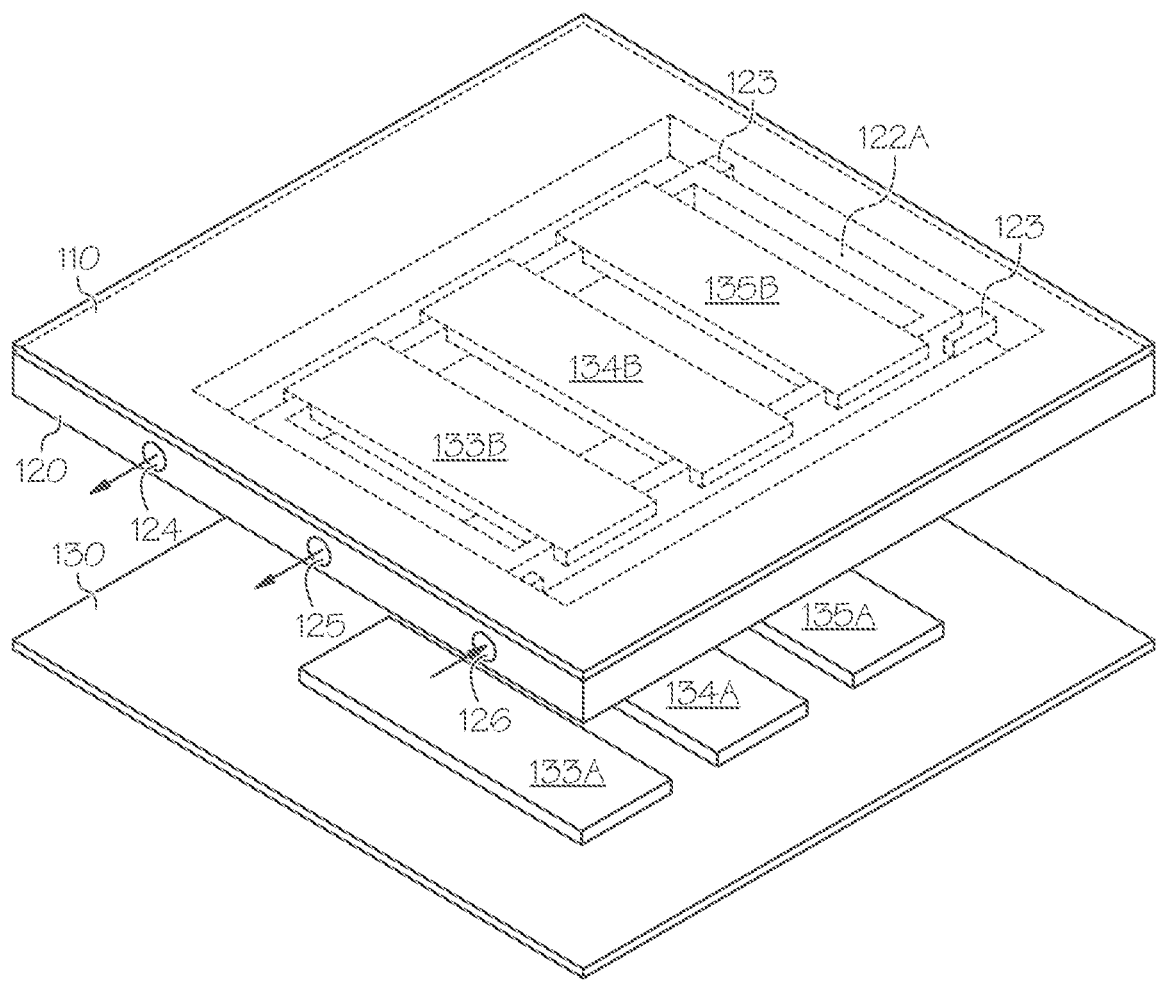
FIG. 5 schematically depicts an illustrative double-sided cold plate, according to one or more embodiments shown and described herein.

Referring now to FIG. 5, an illustrative double-sided cold plate having two-phase cooling structures is depicted. In some embodiments, the cold plate 100 implements a first cooling surface 110 having one or more first cooling structures 133B, 134B, 135B bonded to the interior surface 111 of the first cooling surface. The one or more first cooling structures 133B, 134B, 135B may be porous wick structures optionally comprising a bulk wick structure and one or more multi-layer porous wick structures positioned therein. Similarly, the cold plate 100 implements a second cooling surface 130 having one or more second cooling structures 133A, 134A, 135A bonded to the interior surface 131 of the second cooling surface 130. The one or more second cooling structures 133A, 134A, 135A may be porous wick structures optionally comprising a bulk wick structure and one or more multi-layer porous wick structures positioned therein. A cold plate as depicted in FIG. 5 may be utilized in a power control unit to cool a pair of power device embedded PCBs 200A, 200B as depicted for example in FIGS. 13 and 14. While FIG. 5 depicts a double-sided cold plate having two-phase cooling structures, it should be understood that the two-phase cooling structures may be replaced with single-phase cooling structures depending on the cooling requirements for the power control unit.

Figure 6:
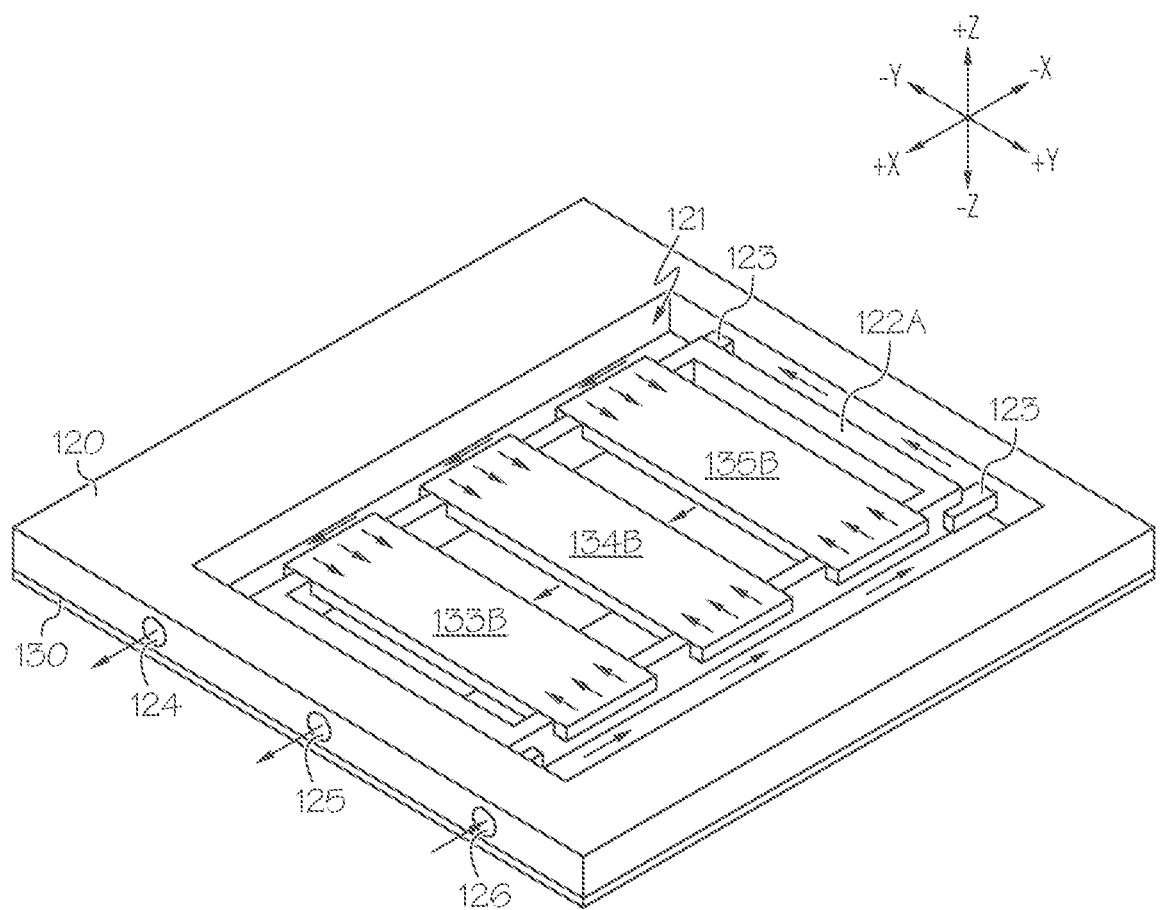
FIG. 6 schematically depicts an illustrative double-sided cold plate having two-phase cooling structures on one side of the double-sided cold plate, according to one or more embodiments shown and described herein.

Referring to FIG. 6, an illustrative double-sided cold plate having two-phase cooling structures on one side of the double-sided cold plate is depicted. In some embodiments, the power control unit may only have cooling structures on one of the cooling surfaces. Here, the second cooling surface 130 may be sufficient for cooling any electronic device coupled to the exterior surface of the second cooling surface 130. For example, the electronic device may generate low or no heat, such that the bulk material that forms the second cooling surface 130 and the fluid flowing over the interior surface of the second cooling surface 130 is sufficient to remove or reduce the heat generated. As described with respect to FIG. 4, fluid may be introduced to the internal cavity 121 of the manifold 120 via an inlet port 126 and flow in a pattern according to the arrows depicted in FIG. 7. Fluid and/or vapor may exit the internal cavity 121 via the vapor outlet port 125 and/or the liquid outlet port 124.

Figure 7:
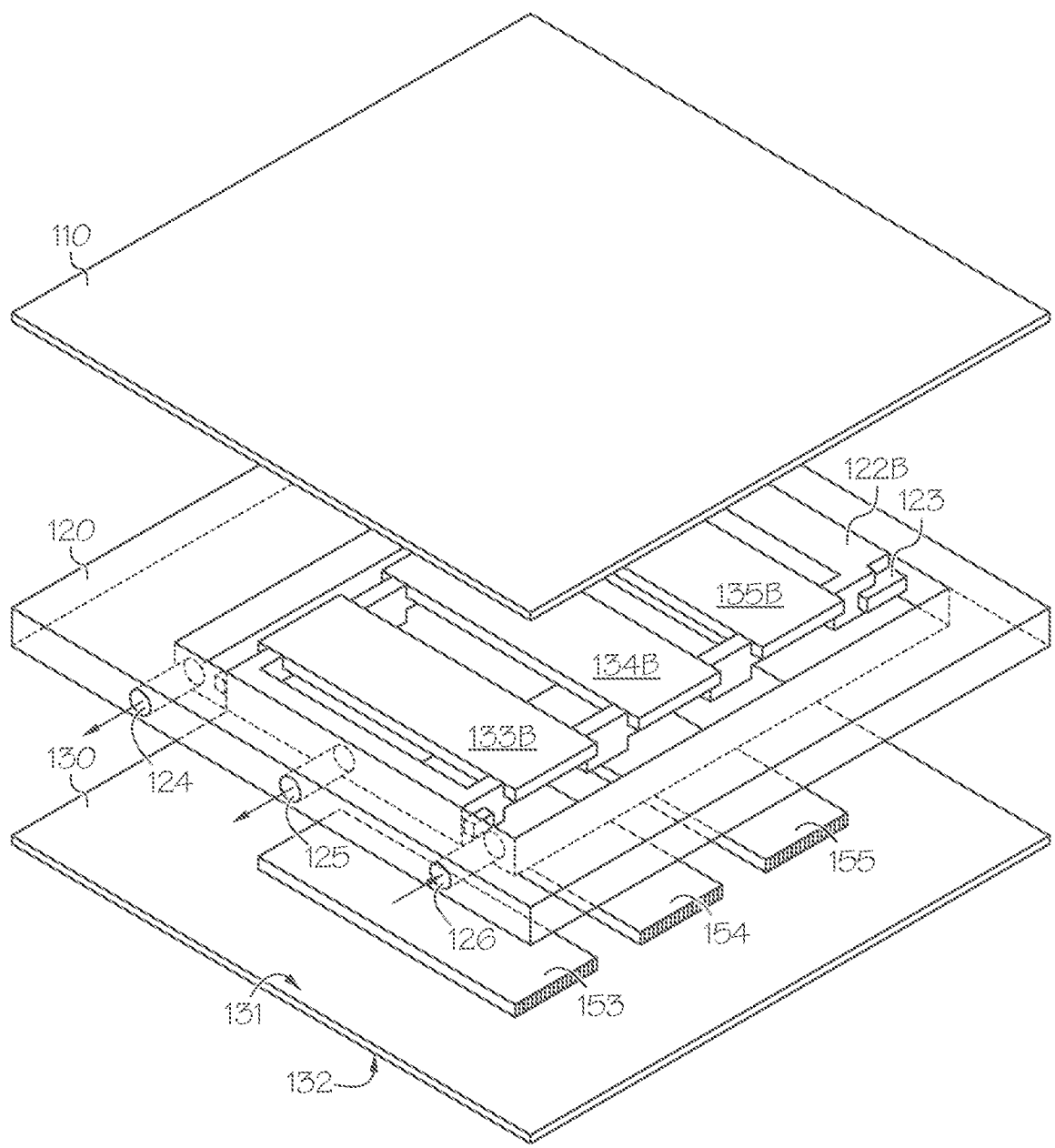
FIG. 7 schematically depicts an exploded view of an illustrative double-sided cold plate having a two-phase cooling surface and a single-phase cooling surface, according to one or more embodiments shown and described herein.

FIG. 7 depicts an exploded view of an illustrative double-sided cold plate having a two-phase cooling surface and a single-phase cooling surface. The first cooling surface 110 includes a first cooling structure comprising two-phase cooling structures 133B, 134B, 135B. The second cooling surface 130 includes a second cooling structure comprising single-phase cooling structures 153, 154, 155 bonded to the interior surface 131 of the second cooling surface 130. The cold plate 100 of the present embodiment enables the single-phase cooling structures 153, 154, 155 and two-phase cooling structures 133B, 134B, 135B to share the same manifold thus reducing the space required for cooling and redundancy in cooling system components as a single cooling system may circulate working fluid throughout a common manifold that serves electronic devices having different heat dissipation needs. For example, the exterior surface 112 of the first cooling surface 110 may be coupled to a power device embedded PCB and the exterior surface 132 of the second cooling surface 130 may be coupled to a capacitor enclosure 300 as depicted and further discussed with reference to FIG. 12.

Figure 8:
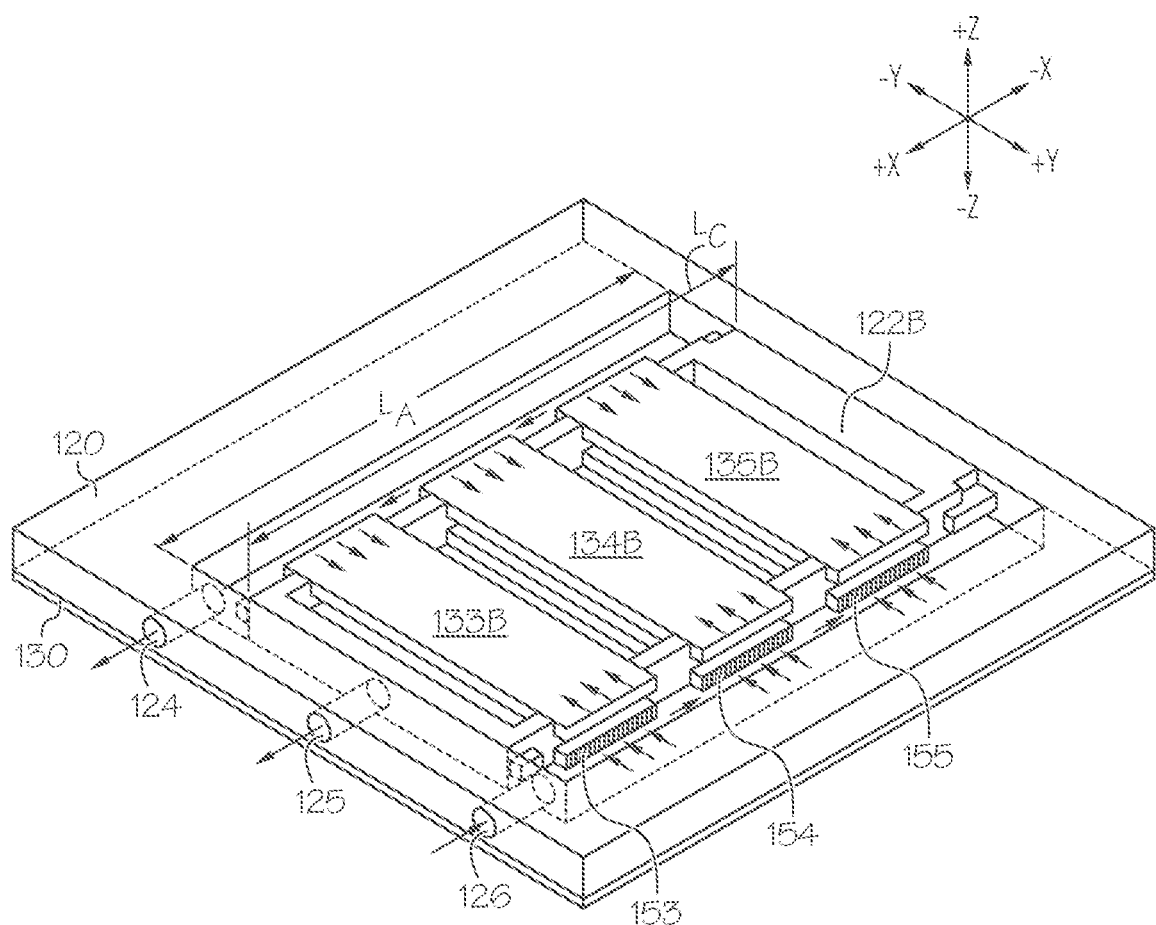
FIG. 8 schematically depicts an illustrative flow within an illustrative double-sided cold plate having a two-phase cooling surface and a single-phase cooling surface, according to one or more embodiments shown and described herein.

In FIG. 7, the two-phase cooling structures 133B, 134B, 135B may be porous wick structures as described herein. The single-phase cooling structures 153, 154, 155 may be fluid channels (also referred to micro channels), which allow fluid to flow relatively unrestricted across predefined surfaces of the second cooling surface 130 to extract and transport heat. In embodiments that implement single-phase cooling structures 153, 154, 155, the flow divider 122B may have a third length $L_C$ that is equal to the first length $L_A$ of the internal cavity 121 of the manifold 120. That is, as depicted in FIG. 8, fluid is no longer able to between the rear wall 120C and the flow divider 122B because a flow divider 122B that has a length greater than the flow divider 122A depicted and described with reference to FIG. 4 blocks the space. By implementing a flow divider 122B having a third length $L_C$ that is equal to the first length $L_A$ of the internal cavity 121 of the manifold 120, the fluid the enters the inlet port 126 is forced to permeate the porous wick structures of the two-phase cooling structures 133B, 134B, 135B, and more specifically, flow through the flow channels of the single-phase cooling structures 153, 154, 155 to effect cooling along the second cooling surface 103. The fluid that flows through the single-phase cooling structures 153, 154, 155 may increase in temperature, but generally remain in liquid form. Once the fluid flows through the single-phase cooling structures 153, 154, 155 the fluid may exit the internal cavity 121 of the manifold through the liquid outlet port 124.

Figure 9:
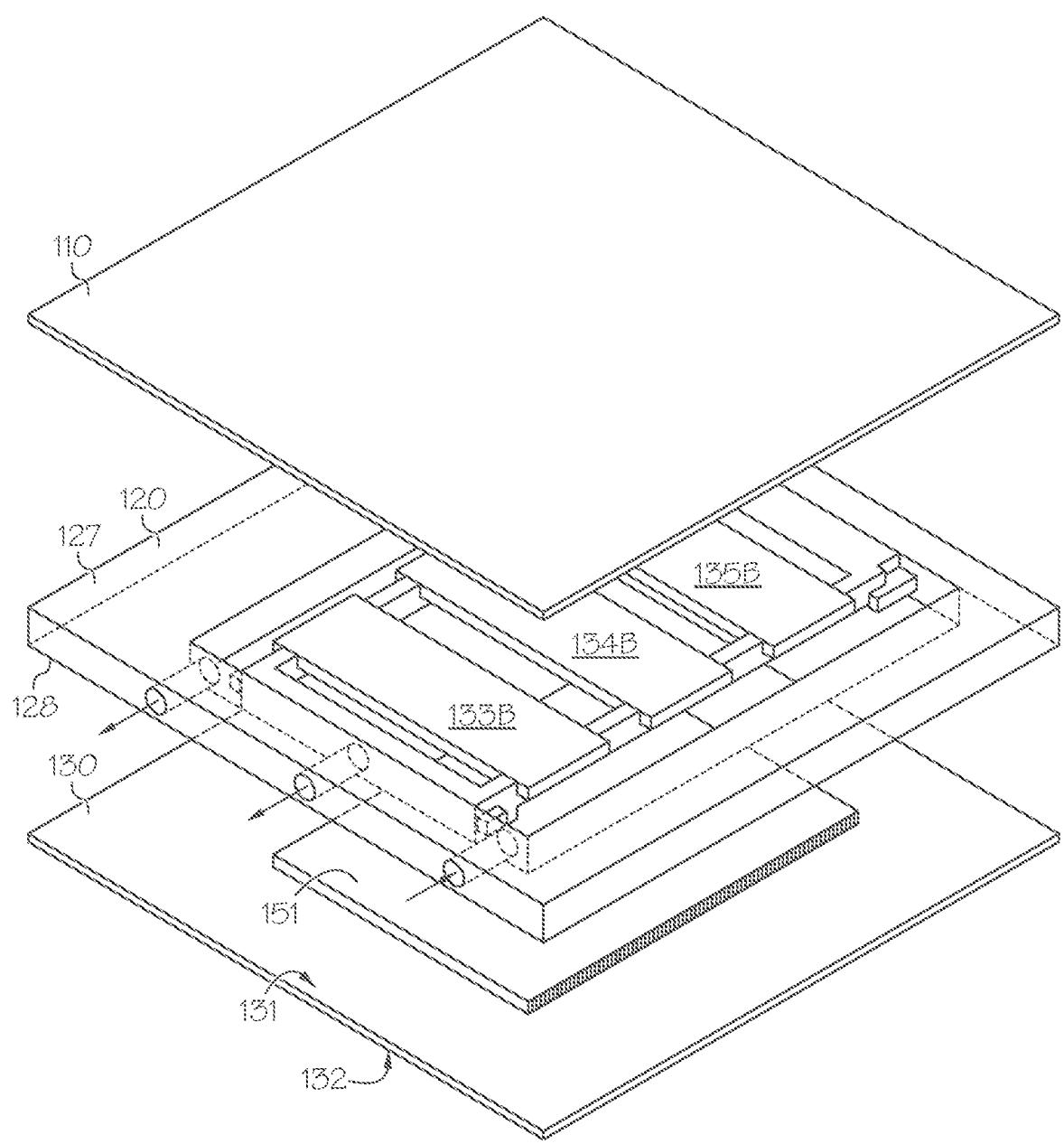
FIG. 9 schematically depicts an exploded view of an another illustrative double-sided cold plate having a two-phase cooling surface and a single-phase cooling surface, according to one or more embodiments shown and described herein.

In some embodiments, the second cooling structure implemented as a single-phase cooling structure 151 may be a plurality of flow channels extending sequentially along a portion of the first length $L_A$ of the internal cavity 121 of the manifold 120 as depicted in FIG. 9. Unlike the segmented and spaced apart single-phase cooling structures 153, 154, 155 as depicted in FIG. 8, the single-phase cooling structure 151 depicted in FIG. 9 implements a series of flow channels that cover a broad surface area of the interior surface 131 of the second cooling surface 130 within the manifold 120.

Figure 10A:
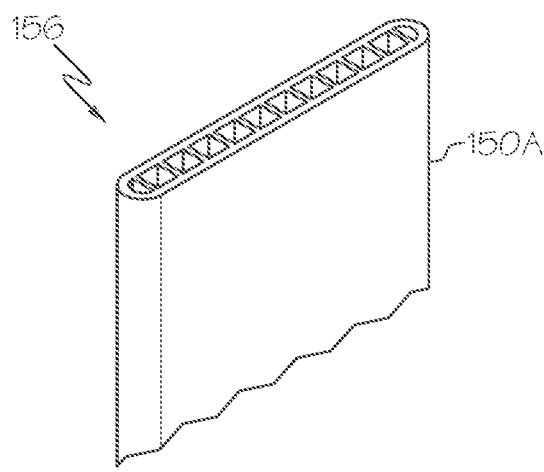
FIG. 10A schematically depicts an illustrative single-phase flow channel having an array of flow channels, according to one or more embodiments shown and described herein.
Figure 10B:
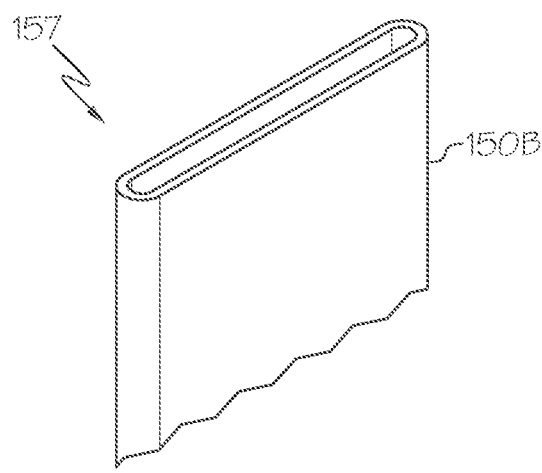
FIG. 10B schematically depicts an illustrative single-phase flow channel having a single flow channel, according to one or more embodiments shown and described herein.
Figure 10C:
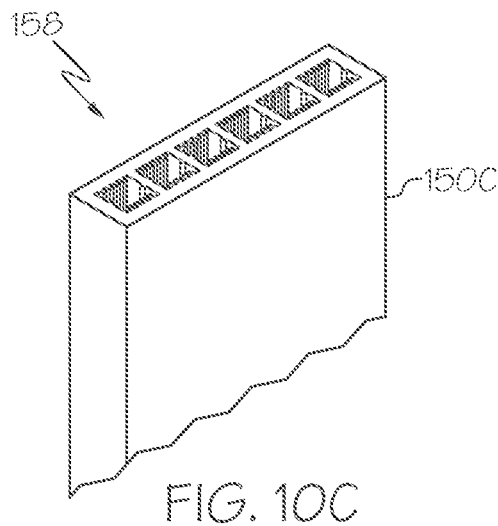
FIG. 10C schematically depicts an illustrative single-phase flow channel having an array of flow channels with internal structures, according to one or more embodiments shown and described herein.

Various configurations and designs of single-phase cooling structures 153, 154, 155 may be implemented to achieve the desired level of heat extraction. For example, referring to FIG. 10A, a single-phase cooling structure 150A may make up the single-phase cooling structures 153, 154, 155 depicted in FIG. 8 may have an array of adjacent fluid channels 156 having a predefined cross-sectional shape. Some example cross-sectional shapes may include a circle, square, triangle, hexagon or any other closed contoured shape. The cross-sectional shape of the fluid channels may vary between adjacent fluid channels. An array of adjacent fluid channels 156 forming single-phase cooling structures 153, 154, 155 provides multi-dimensional surfaces that the working fluid may flow over and extract heat conducting through material of the single-phase cooling structures 153, 154, 155. FIG. 10B depicts an example of a single-phase cooling structure 150B that may be a single fluid channel 157. A single fluid channel 157 may improve heat extraction because a large volume of fluid may flow though the single fluid channel 157 as opposed to a single-phase cooling structure 150B that has an array of fluid channels 156. FIG. 10C depicts yet another example of a single-phase cooling structure 150C. The single-phase cooling structure 150C may include an array of fluid channels 158 where one or more of the fluid channels 158 has a set of microchannels defined along the length of the fluid channel 158. The microchannels within the fluid channel 158 increase the surface area of that the fluid comes into contact with as it flows through the single-phase cooling structure 150C, thereby extracting additional heat. It should be understood that single-phase cooling structures 150A, 150B, 150C may be implanted as the single-phase cooling structures 153, 154, 155 depicted in FIGS. 7 and 8.

Figure 11:
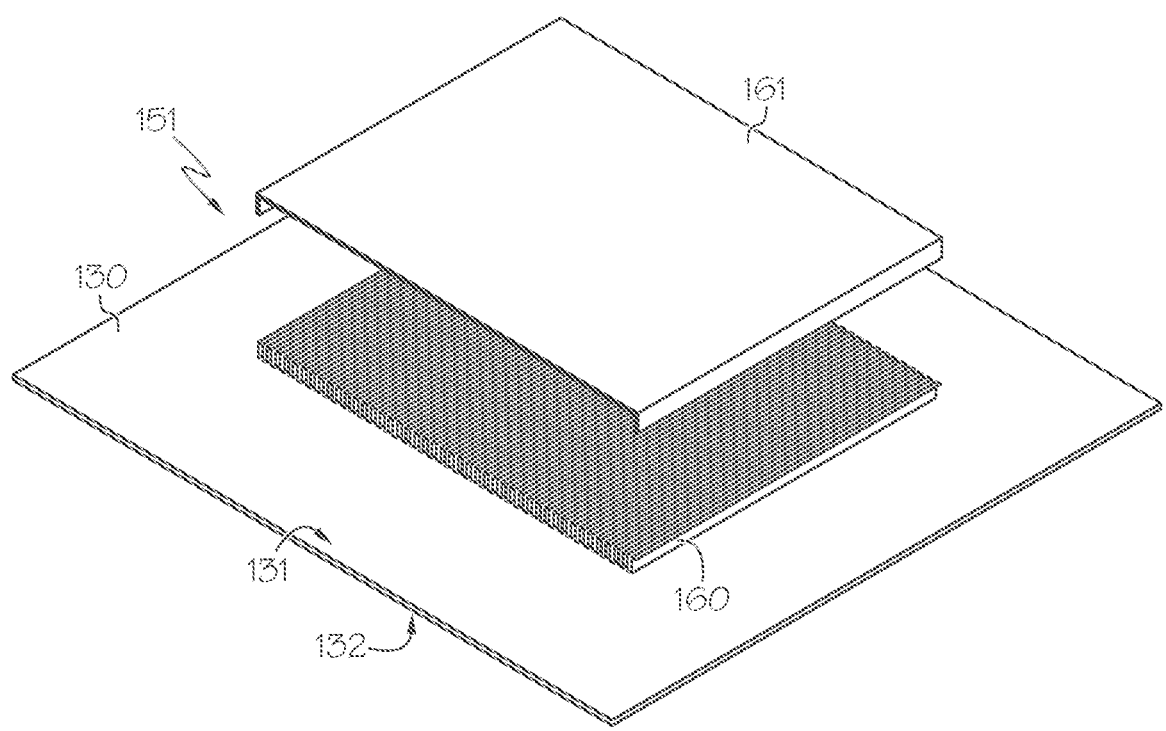
FIG. 11 schematically depicts an illustrative single-phase flow channel having a fold fin structure positioned with a cover, according to one or more embodiments shown and described herein.

Referring to FIG. 11, an example construction of an illustrative single-phase flow channel 151 is depicted. The single-phase flow channel 151 may be formed by bonding a fold fin structure 160 to the interior surface 131 of the second cooling surface 130 and enclosing the top of the fold fin structure 160 with a cover 161 to form a plurality of fluid channels. Folded fins provide more surface area and design flexibility than extruded heat sinks and other fabrications. For example, folded fins may be created by a progressive stamping method or by bending, for example, aluminum or copper) sheets into a variety of fin shapes which are then bonded to a separate base. The folded fin could be varieties of other fins, such as circular pin fins, elliptic pin fins, etc. It should be noted that the channel width does not have to be uniform. They could be tuned to provide customized cooling depending on the power level of the different heat sources attached to different locations on the single-phase cooling surface. The fins are then bonded to the second cooling surface 130 with thermally conductive epoxy, brazing, welding, or similar metallurgical bonds, to create a heat sink. An advantage of folded fin structures is the ability to combine aluminum and copper to tailor the performance of the heat sink to the particular application. If the heat must be spread over a large heat sink base, copper can be used for its high conductivity, yet the heat sink fins can be produced from aluminum, due to its low weight and cost. The cover 161 enables working fluid to flow through and between the folds of the folded fin structure 160 thereby providing enclosed channels for working fluid to flow.

Figure 12:
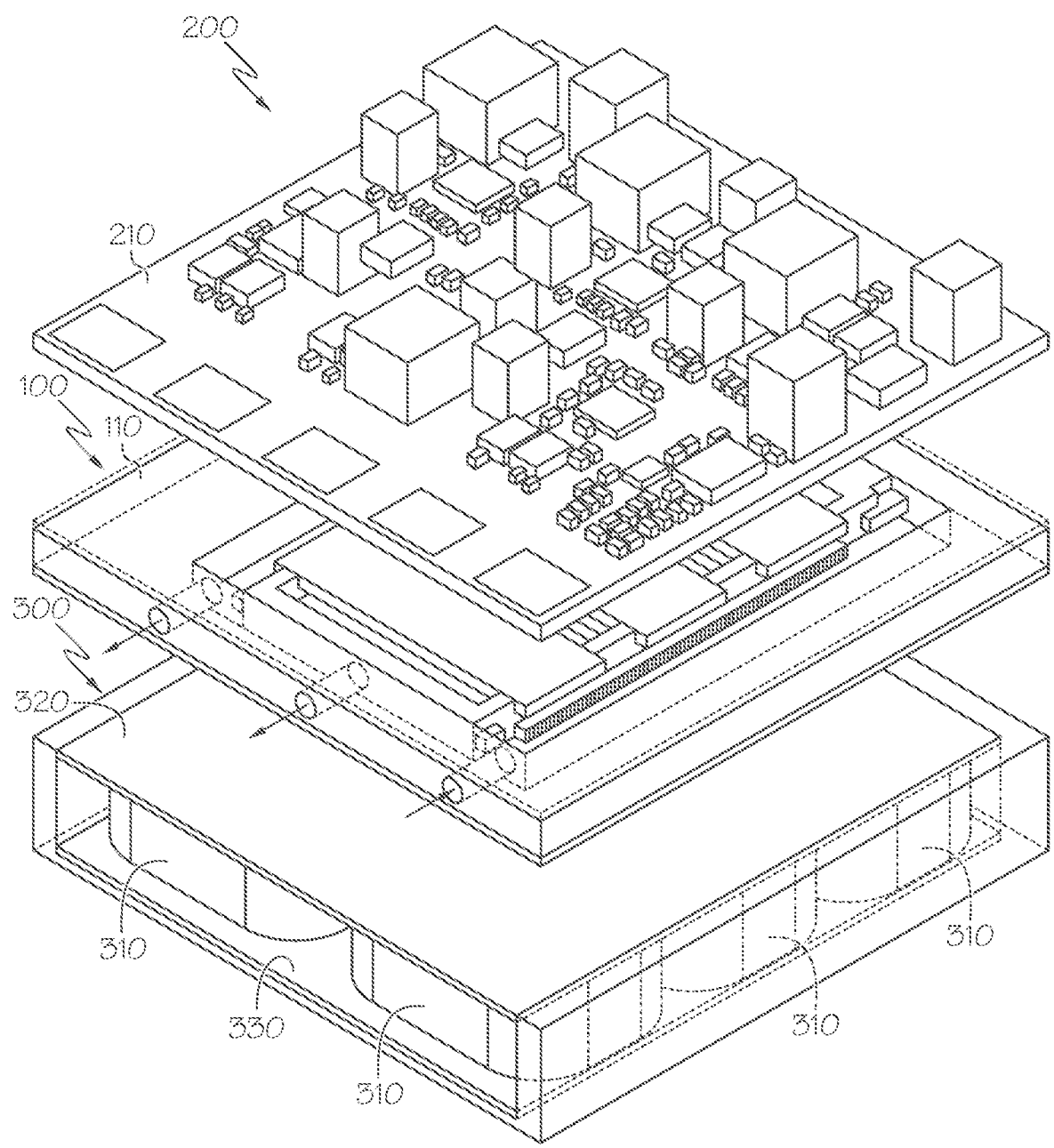
FIG. 12 schematically depicts an illustrative power control units (PCUs) having a cold plate of the present disclosure positioned between an power device embedded printed circuit board (PCB) and capacitor enclosure having capacitors, according to one or more embodiments shown and described herein.
Figure 13:
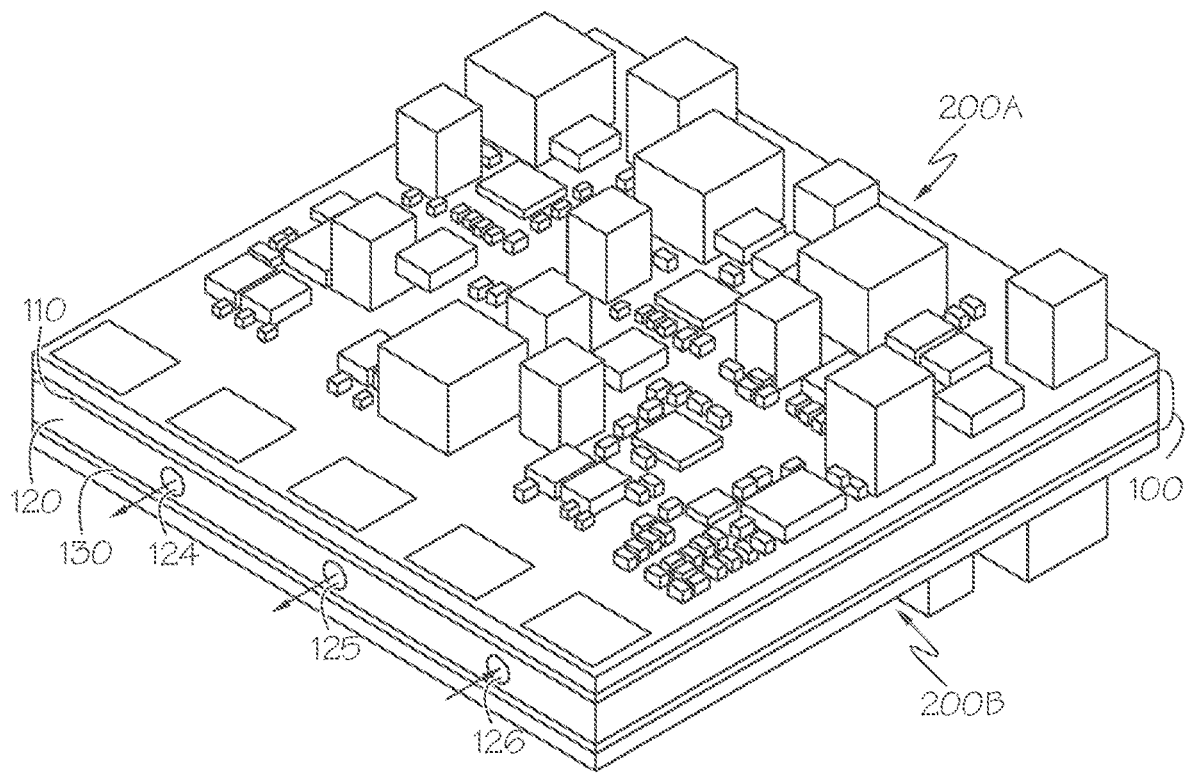
FIG. 13 schematically depicts an illustrative power control units (PCUs) having a cold plate of the present disclosure positioned between two power device embedded PCBs, according to one or more embodiments shown and described herein.
Figure 14:
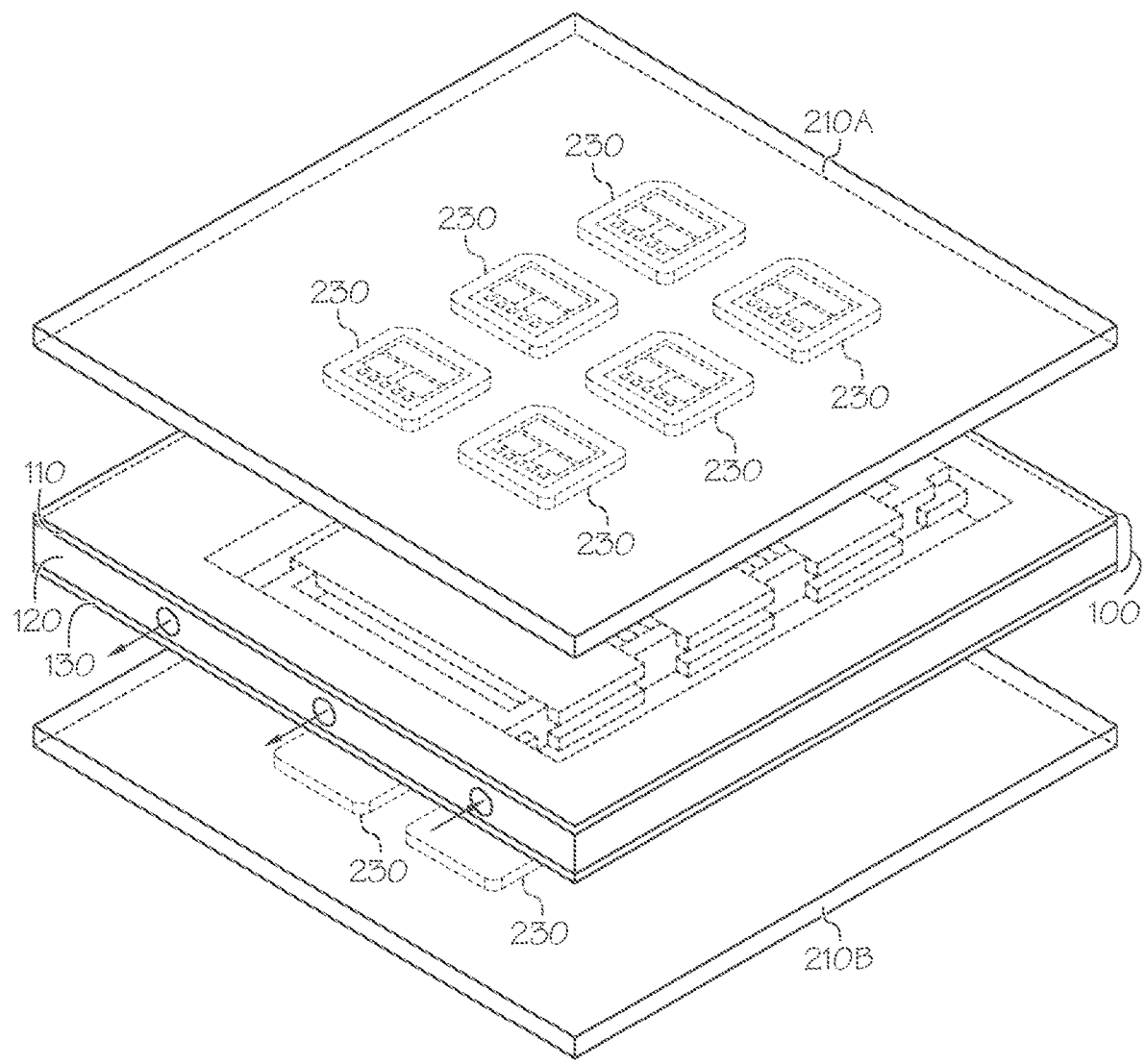
FIG. 14 schematically depicts an exploded view of an illustrative power control units (PCUs) having a cold plate of the present disclosure positioned between two power device embedded PCBs, according to one or more embodiments shown and described herein.

Turning to FIGS. 12-14, illustrative power control units (PCUs) implementing the cold plates described herein are depicted. For example, FIG. 12 schematically depicts an illustrative power control units (PCUs) having a cold plate 100 of the present disclosure positioned between an power device embedded printed circuit board (PCB) 200 and capacitor enclosure 300 having a plurality of capacitors 310. A PCB 210 of the power device embedded PCB 200 may be thermally coupled to the exterior surface of the first cooling surface 110. The power device embedded PCB configurations utilize the electrical conductive properties of the copper substrates to connect to the power devices through a second surface, for example, the bottom of the copper substrates via vias. Similarly, a bus or top surface 320 of the capacitor enclosure 300 having a plurality of capacitors 310 is thermally coupled to the exterior surface of the second cooling surface 130. The cold plate 100 is configured to implement single-phase cooling structures positioned adjacent the top surface 320 of the capacitor enclosure 300 to aid in the extraction of heat generated by the plurality of capacitors 310 distributed throughout the capacitor enclosure 300. The cold plate 100 is further configured along the opposing cooling surface to implement two-phase cooling structures to remove heat generated by the power devices embedded within the embedded PCB 200.

FIG. 13 schematically depicts an illustrative power control units (PCUs) having a cold plate of the present disclosure positioned between two power device embedded PCBs 200A and 200B. The first power device embedded PCB 200A is thermally bonded to the first cooling surface 110 and the second power device embedded PCB 200B is thermally bonded to the second cooling surface 130. Cold plates such as those described herein provide a close and tailored heat extraction from power device embedded PCBs and other electronic devices. The cold plate designs provide different cooling mechanisms on its two sides, one side is two-phase cooling and the other side is single phase cooling, which can be tailored for automotive power electronics system. For example, if both sides of the cold plate 100 include power device embedded PCBs 200A and 200B, and one power device embedded PCB 200A is higher power, for example generating more heat than the other power device embedded PCB 200B, then one side of the cold plate 100 may include a two-phase cooling mechanism and the other side of the cold plate 100 may include a single phase cooling mechanism. As another non-limiting example, if both sides of the cold plate 100 include power device embedded PCBs 200A and 200B, then both sides of the cold plate may include two-phase cooling mechanisms. FIG. 14 depicts an exploded view of an illustrative power control units (PCUs) (e.g., the PCU depicted in FIG. 13) having a cold plate of the present disclosure positioned between two power device embedded PCBs. The PCBs 210A and 210B of the power device embedded PCBs 200A and 200B, respectively, are only illustrated so that the embedded power devices 230 may be illustrated. For example, in FIG. 14 there are two layers of PCBs 200A and 200B that are positioned on opposing sides of a cold plate. The power device embedded PCBs 200A and 200B may include a number of power devices within each layer. For example, but without limitation, each layer may include 1, 2, 3, 4, 5, 6, 7, 8, or more power devices per layer. Accordingly, in some embodiments, a PCU may include 12 power devices, 6 power devices in each PCB layer. In further embodiments, the PCU may have three power device embedded PCBs each separated by a cold plates, where each PCB layer includes 6 power devices for a total of 18 power devices within the PCU. PCUs may have even more layers and additional cold plates coupled in parallel. The embedded power devices 230, which generate heat when operating are effectively cooled by designing the cold plate such that the first and second cooling structures are positioned adjacent the locations of the embedded power devices 230. The exploded view illustrates that the embedded power devices 230 and their corresponding first and second cooling structures align with each other when the PCU is assembled.

PCB materials may include any known or yet to be discovered materials, for example, without limitation, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), PTFE (Polytetrafluoroethylene), RF-35 (fiberglass-reinforced ceramics-filled PTFE), alumina, polyimide. PCB material may be a laminate, cloth or fiber material, resin, silicon, polymer, or the like. PCB material may be chosen based on the temperature range (e.g., the operating temperature) of the embedded power devices.

The embedded power devices 230 and any others depicted and described herein may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the plurality of embedded power devices 230 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the embedded power devices 230 operate at high current and/or high power (for example, greater than or equal to 40 kW, 50 kW, 60 kW, 70 kW, 80 kW, 90 kW, 100 kW, 110 kW, 120 kW, 130 kW, 140 kW, or 150 kW) and under high temperatures (for example, in excess of 100° C., 150° C., 175° C., 200° C., 225° C., or 250° C.) and generate a large amount of heat that must be removed for the continued operation of the example p embedded power devices 230.

Turning now to FIGS. 15-19, depict example cooling systems implementing the various cold plate embodiments shown and described herein. Generally referring to FIGS. 15-19, cooling systems include a fluid reservoir 410, a pump 440, and a cold plate 100. The cold plate 100 includes an inlet port 126 and at least one of a liquid outlet port 124 and/or a vapor outlet port 125. The fluid reservoir 410 may be any vessel capable of receiving, holding and dispensing fluid. The liquid outlet port 124 may feed fluid from the cold plate 100 to the fluid reservoir 410. The pump 440 may be any pump capable of moving fluid from one location to another. The pump 440 may directly or indirectly be fluidly coupled fluid reservoir 410. The pump 440 extracts fluid from the fluid reservoir 410 and directly or indirectly inputs the fluid into the cold plate via an inlet port 126. Some cooling systems include a vapor condenser 420, which receives vapor from the cold plate and condenses the vapor back into liquid form. The vapor condenser 420 may be a passive cooling devices such as a plurality of folded fins in which the vapor passes over and thereby condenses into a liquid that drains out of the vapor condenser 420. Other vapor condensers 420 may be actively cooled systems and/or forced air systems that increase the rate of cooling of the vapor, thus condensing the vapor to liquid form. The vapor condenser 420 may fluidly couple to the fluid reservoir 410 such that condensed liquid is deposited in the fluid reservoir 410.

In some embodiments, the cooling system includes a condenser 430, which cools the liquid to a desired temperature before the fluid is introduced from the fluid reservoir 410 into the cold plate 100. The condenser may be a chiller 415 (e.g., a chiller coil or a similar condenser device) configured to reduce the temperature of the fluid stored in the fluid reservoir 410. In further embodiments, one or more valves 450 and filters 460 may be fluidly coupled to segments of the cooling system to provide control and purification, respectively, of the fluid.

Figure 15:
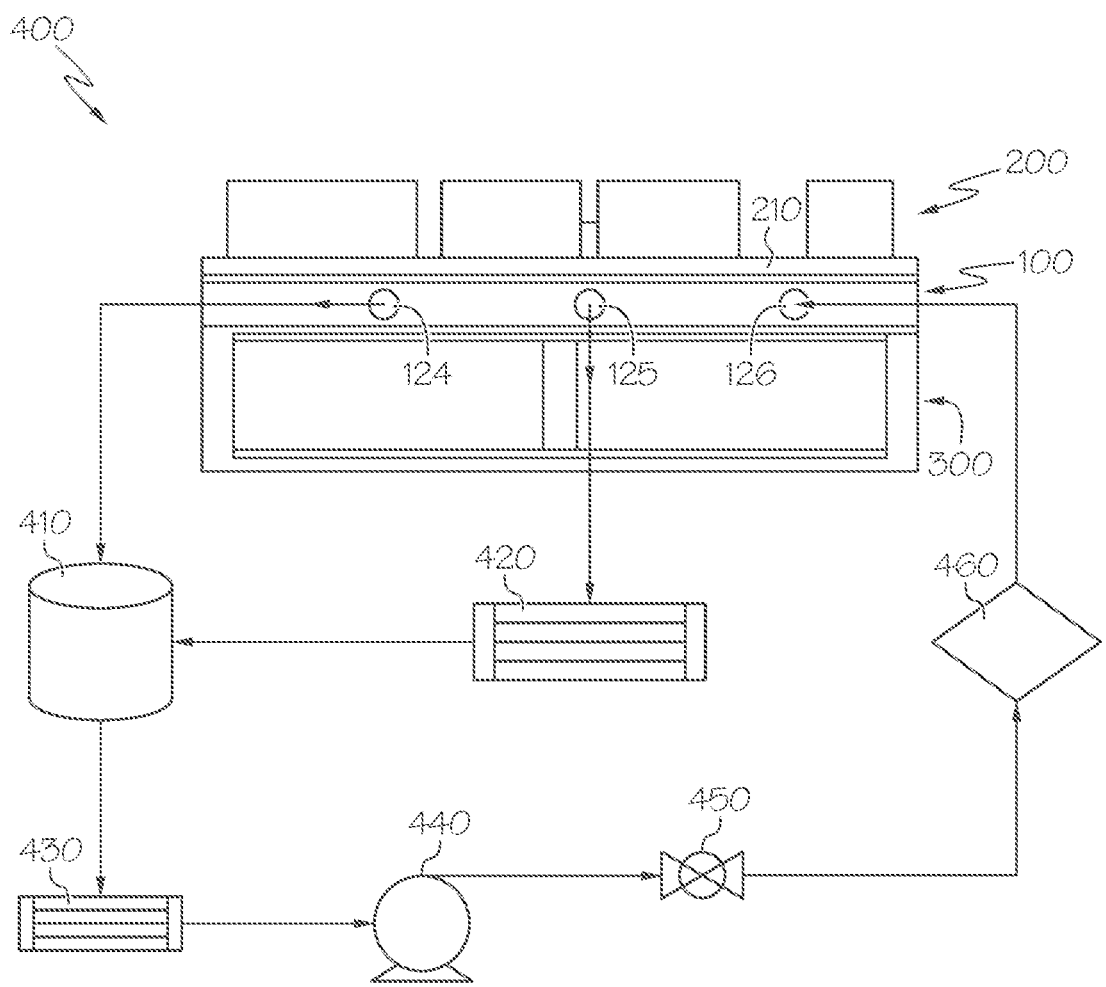
FIG. 15 schematically depicts an illustrative cooling system for a cold plate of the present disclosure, according to one or more embodiments shown and described herein.

In a first non-limiting example, with reference to FIG. 15, a cooling system 400 includes a fluid reservoir 410, a vapor condenser 420, a condenser 430, a pump 440, a valve 450, a filter 460, and the cold plate 100. The liquid outlet port 124 of the cold plate is fluidly coupled to the fluid reservoir 410. The vapor outlet port 125 is fluidly coupled to the vapor condenser 420, which is further fluidly coupled to the fluid reservoir 410. A condenser 430 receives fluid from the fluid reservoir 410 and optionally further reduces the temperature of the fluid. A pump 440 draws fluid from the fluidly coupled fluid reservoir 410 and condenser 430 through a filter 460 and into the inlet port 126 of the cold plate. One or more valves 450 are fluidly coupled between components of the cooling system to provide shut-off control or diversion control of the fluid within the cooling system 400.

Figure 16:
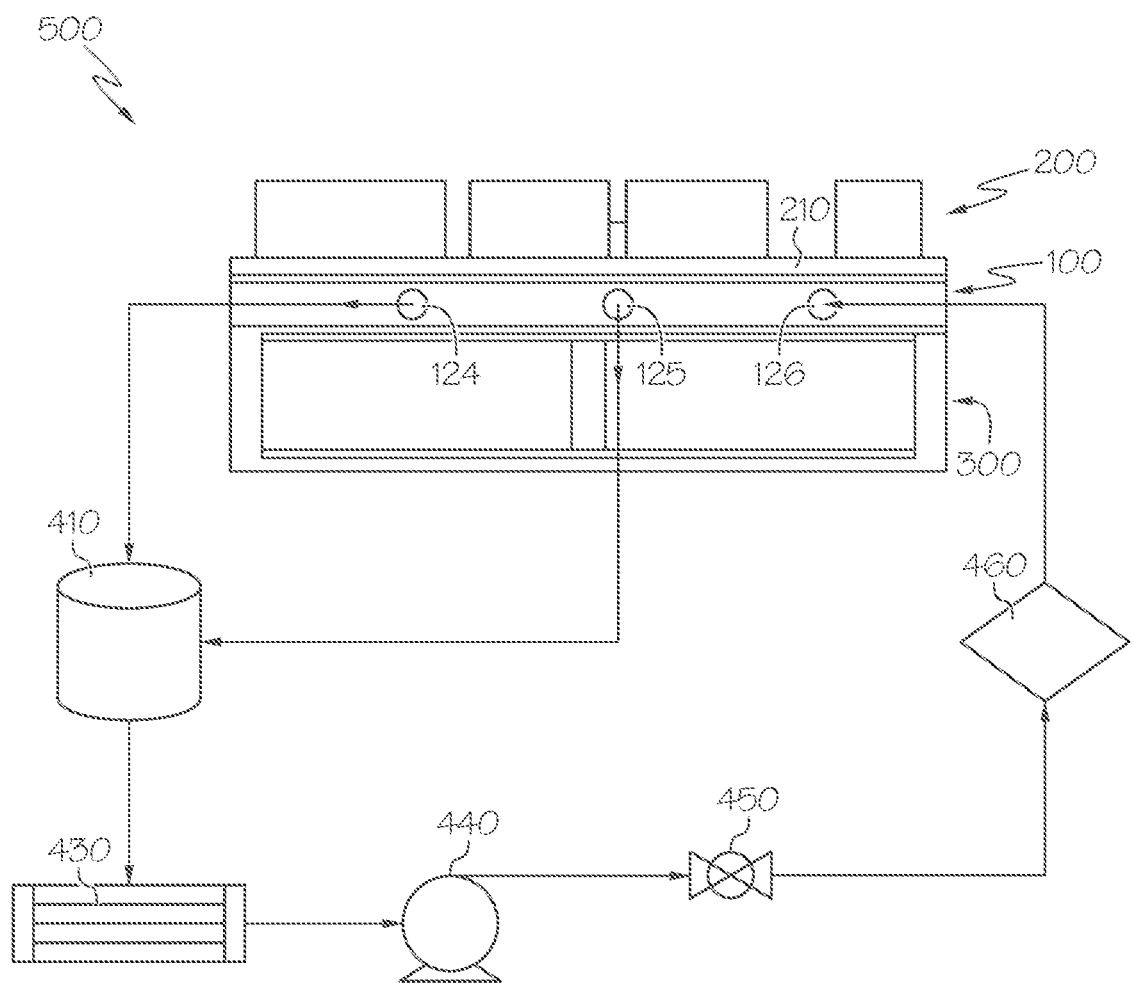
FIG. 16 schematically depicts another illustrative cooling system for a cold plate of the present disclosure, according to one or more embodiments shown and described herein.

In another non-limiting example, with reference to FIG. 16, a cooling system 500 includes a fluid reservoir 410, a condenser 430, a pump 440, a valve 450, a filter 460, and the cold plate 100. The liquid outlet port 124 and the vapor outlet port 125 of the cold plate are fluidly coupled to the fluid reservoir 410. A condenser 430 receives fluid from the fluid reservoir 410 and optionally further reduces the temperature of the fluid. A pump 440 draws fluid from the fluidly coupled fluid reservoir 410 and condenser 430 through a filter 460 and into the inlet port 126 of the cold plate. One or more valves 450 are fluidly coupled between components of the cooling system to provide shut-off control or diversion control of the fluid within the cooling system 400.

Figure 17:
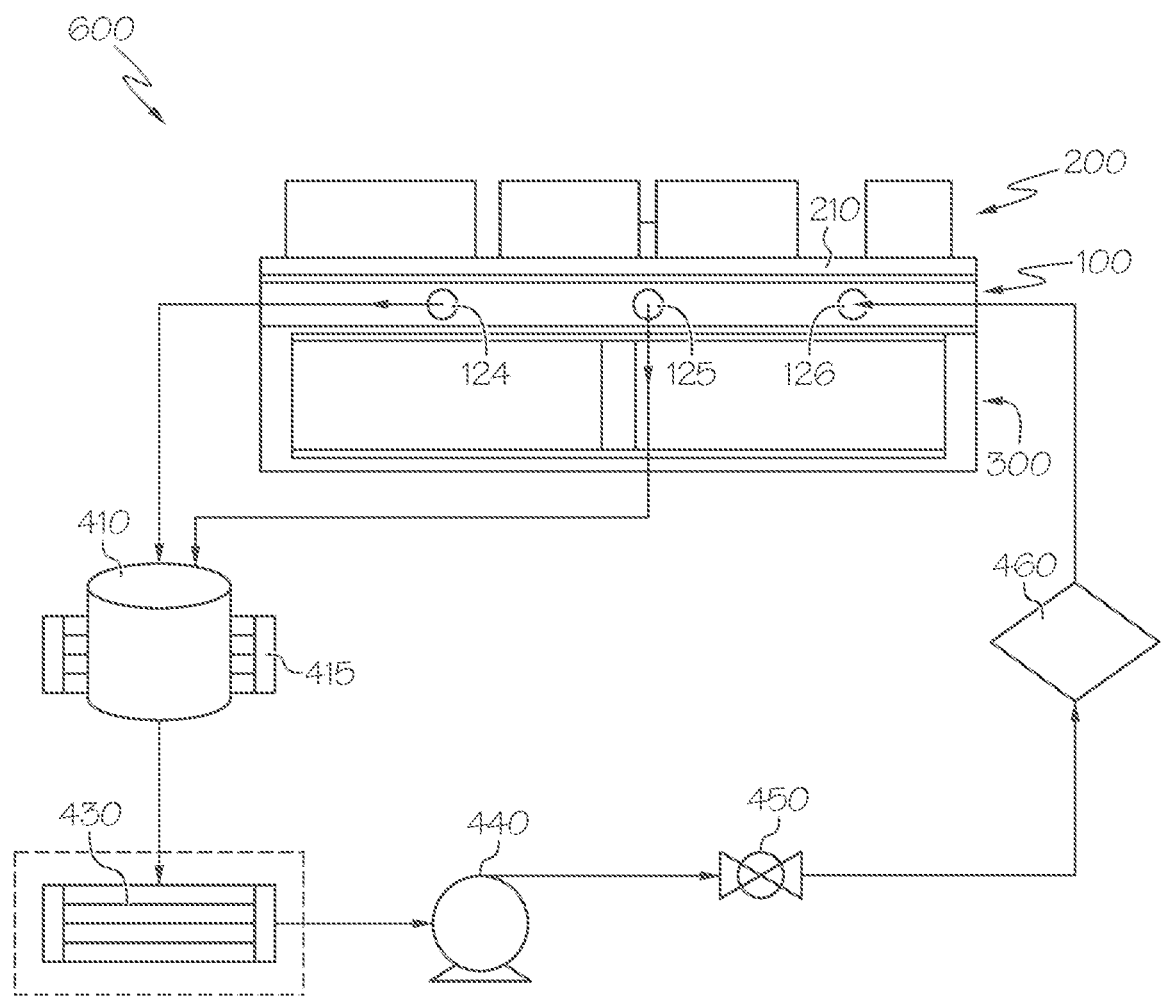
FIG. 17 schematically depicts another illustrative cooling system for a cold plate of the present disclosure, according to one or more embodiments shown and described herein.

In another non-limiting example, with reference to FIG. 17, a cooling system 600 includes a fluid reservoir 410, a chiller 415 and/or a condenser 430, a pump 440, a valve 450, a filter 460, and the cold plate 100. The liquid outlet port 124 and the vapor outlet port 125 of the cold plate are fluidly coupled to the fluid reservoir 410. In the present embodiment, a chiller 415 may be implemented with the fluid reservoir 410 to cool the fluid within the fluid reservoir 410 rather than chilling the solely chilling the fluid with the condenser 430. A condenser 430 may be optionally implemented to receive fluid from the fluid reservoir 410 to further reduce the temperature of the fluid. A pump 440 draws fluid from the fluidly coupled fluid reservoir 410 and condenser 430 through a filter 460 and into the inlet port 126 of the cold plate. One or more valves 450 are fluidly coupled between components of the cooling system to provide shut-off control or diversion control of the fluid within the cooling system 400.

Figure 18:
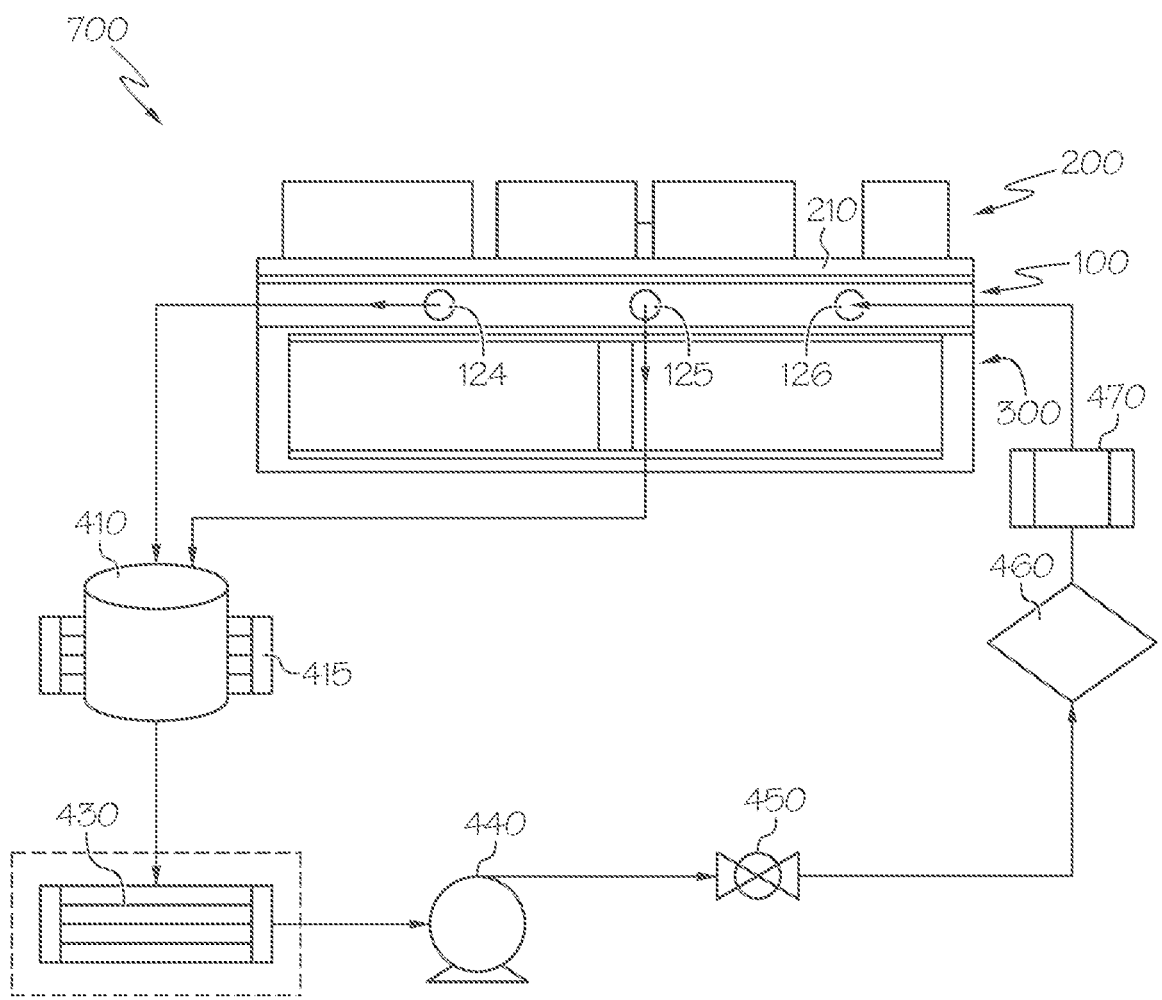
FIG. 18 schematically depicts another illustrative cooling system for a cold plate of the present disclosure, according to one or more embodiments shown and described herein.
Figure 19:
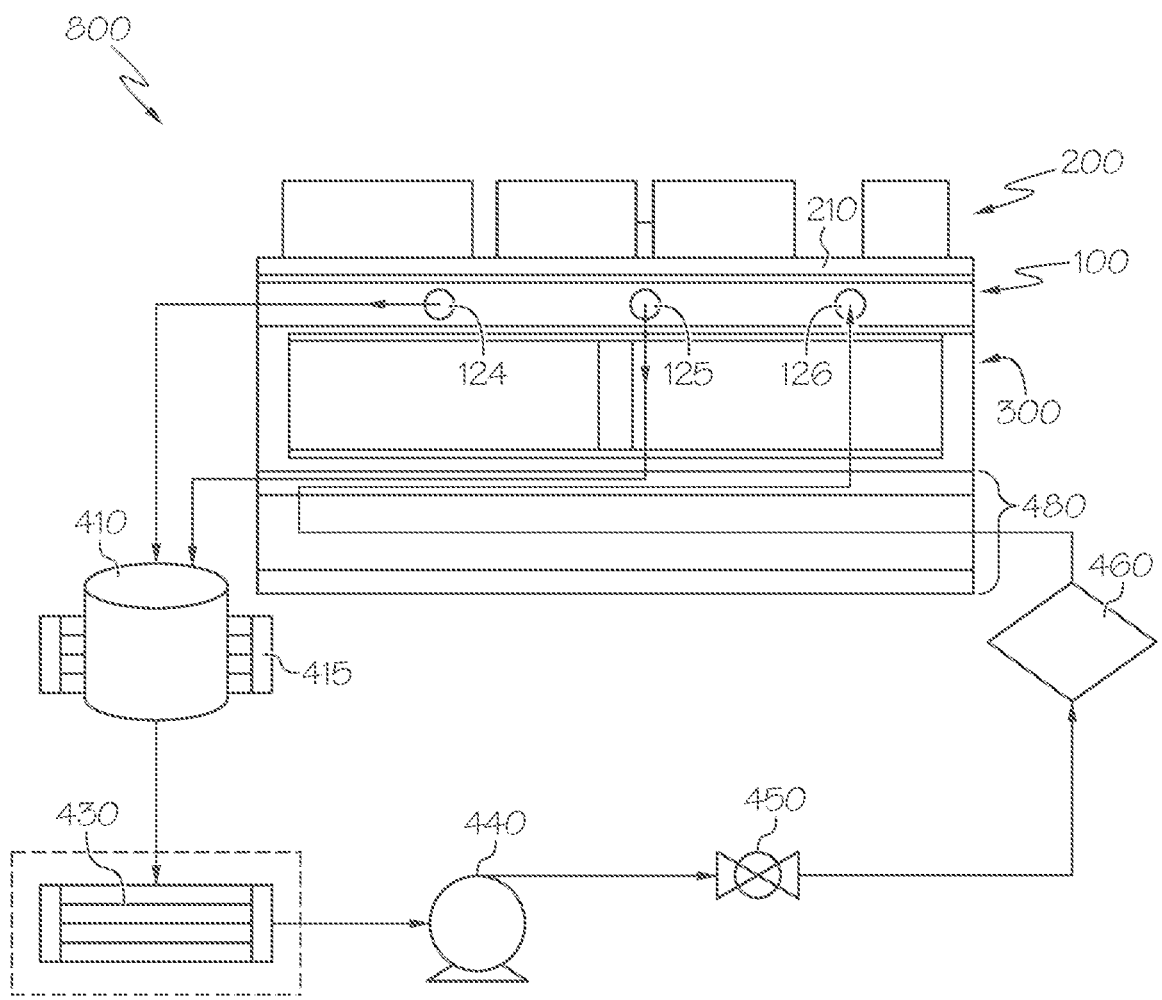
FIG. 19 schematically depicts another illustrative cooling system for a cold plate of the present disclosure, according to one or more embodiments shown and described herein.

Cooling system 700 depicted in FIG. 18 is similar to cooling system 600 depicted in FIG. 17. However, the cooling system 700 depicted with reference to FIG. 18, includes a motor 470 (e.g., an electric or fossil fuel motor) that is cooled by the fluid being delivered to the cold plate 100. For example, since the cooling system 700 chills the fluid, the fluid may initially be used to regulate the temperature of a motor 470 before being used to cool the PCU via the cold plate 100. The motor 470 depicted in FIG. 18 may be located remotely of the PCU. However, as depicted in FIG. 19, the motor may be collocated with the PCU and may further be cooled through thermal coupling the motor 480 to the capacitor enclosure 300 (or other thermally conductive means) with the cold plate 100.

It should now be understood that the embodiments described herein are directed to various configurations of a power control unit implementing a double-sided hybrid cold plate to improve heat extraction from the power control unit. The double-sided hybrid cold plate allows PCUs to be reduced in size by combining single-phase and two-phase cooling structures within a common manifold and thermally coupling them directly to the devices within the PCU that require cooling.

In embodiments, a cold plate of the present disclosure includes a first cooling surface comprising a first cooling structure bonded to an inner surface of the first cooling surface, a second cooling surface comprising a second cooling structure bonded to an inner surface of the second cooling surface, a manifold comprising an internal cavity defined by a first length, a first width, and a first height, and a flow divider defined by a second length, a second width, and a second height. The manifold is enclosed by the first cooling surface and the second cooling surface on opposing surfaces of the manifold separated by the first height. The flow divider is positioned within the internal cavity of the manifold. The flow divider supports and separates the first cooling structure and the second cooling structure by a portion of the second height of the flow divider.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cold plate comprising:
a first cooling surface comprising a first cooling structure bonded to an inner surface of the first cooling surface;
a second cooling surface comprising a second cooling structure bonded to an inner surface of the second cooling surface;
a manifold comprising an internal cavity defined by a first length, a first width, and a first height; and
a flow divider defined by a second length, a second width, and a second height, wherein:
the manifold is enclosed by the first cooling surface and the second cooling surface on opposing surfaces of the manifold separated by the first height,
the flow divider is positioned within the internal cavity of the manifold, and
the flow divider supports and separates the first cooling structure and the second cooling structure by a portion of the second height of the flow divider.

2. The cold plate of claim 1, wherein the first cooling structure comprises a two-phase cooling structure and the second cooling structure comprises a single-phase cooling structure.

3. The cold plate of claim 1, wherein the first cooling structure and the second cooling structure each comprise two-phase cooling structures.

4. The cold plate of claim 1, wherein the first cooling structure and the second cooling structure each comprise single-phase cooling structures.

5. The cold plate of claim 1, wherein the first cooling structure comprises a plurality of wick structures each separated from one another along the second length of the flow divider.

6. The cold plate of claim 5, wherein the plurality of wick structures comprises a bulk porous wick structure and one or more multi-layer porous wicks configured within the bulk porous wick structure.

7. The cold plate of claim 1, wherein the second cooling structure comprises a single-phase flow channel having at least one flow channel extending along a portion of the first width of the manifold.

8. The cold plate of claim 1, wherein the second cooling structure comprises a plurality of single-phase flow channels extending along a portion of the first width of the manifold.

9. The cold plate of claim 8, wherein the plurality of single-phase flow channels are configured in at least two groups, each having one or more flow channels, wherein each of the at least two groups are separated by a predefined spacer along the second length of the flow divider.

10. The cold plate of claim 8, wherein the plurality of single-phase flow channels extend serially along the first length of the manifold.

11. The cold plate of claim 1, wherein the manifold further comprises an inlet port, a vapor outlet port, and a liquid outlet port, each extending from an exterior surface of the manifold into the internal cavity.

12. A power control unit (PCU) comprising:
a power device embedded printed circuit board (PCB) comprising one or more power devices embedded within the power device embedded PCB; and
a cold plate coupled to the power device embedded PCB, wherein the cold plate comprises:
a first cooling surface comprising a first cooling structure bonded to an inner surface of the first cooling surface;
a second cooling surface comprising a second cooling structure bonded to an inner surface of the second cooling surface;

a manifold comprising an internal cavity defined by a first length, a first width, and a first height; and
a flow divider defined by a second length, a second width, and a second height, wherein:
the manifold is enclosed by the first cooling surface and the second cooling surface on opposing surfaces of the manifold separated by the first height,
the flow divider is positioned within the internal cavity of the manifold, and
the flow divider supports and separates the first cooling structure and the second cooling structure by a portion of the second height of the flow divider,
wherein the power device embedded PCB is coupled to the cold plate on an exterior surface of the first cooling surface.

13. The power control unit of claim 12, further comprising a second power device embedded PCB comprising one or more power devices embedded within the second power device embedded PCB, wherein the second power device embedded PCB is coupled to the cold plate on an exterior surface of the second cooling surface.

14. The power control unit of claim 13, wherein the first cooling structure and the second cooling structure each comprise two-phase cooling structures.

15. The power control unit of claim 12, further comprising a capacitor, wherein the capacitor is coupled to the cold plate on an exterior surface of the second cooling surface.

16. The power control unit of claim 15, wherein the first cooling structure comprises a two-phase cooling structure and the second cooling structure comprises a single-phase cooling structure.

17. A cooling system comprising:
a fluid reservoir;
a pump fluidly coupled to the fluid reservoir; and
a cold plate comprising:
    a first cooling surface comprising a first cooling structure bonded to an inner surface of the first cooling surface;
    a second cooling surface comprising a second cooling structure bonded to an inner surface of the second cooling surface;
    a manifold comprising:
        an internal cavity defined by a first length, a first width, and a first height, and
        an inlet port, a vapor outlet port, and a liquid outlet port, each extending from an exterior surface of the manifold into the internal cavity; and
    a flow divider defined by a second length, a second width, and a second height, wherein:
    the manifold is enclosed by the first cooling surface and the second cooling surface on opposing surfaces of the manifold separated by the first height,
    the flow divider is positioned within the internal cavity of the manifold, and
    the flow divider supports and separates the first cooling structure and the second cooling structure by a portion of the second height of the flow divider,
    wherein:
        the pump is fluidly coupled to the inlet port of the manifold, and
        the liquid outlet port and the vapor outlet port are fluidly coupled to the fluid reservoir.

18. The cooling system of claim 17, further comprising a vapor condenser fluidly coupled to the vapor outlet port, wherein the vapor condenser is fluidly positioned between the vapor outlet port and the fluid reservoir.

19. The cooling system of claim 17, further comprising a condenser fluidly coupled to the fluid reservoir and the pump, wherein the condenser is fluidly positioned between the fluid reservoir and the pump.

20. The cooling system of claim 17, further comprising at least one of a valve or a filter fluidly coupled to the pump and the inlet port, wherein the least one of the valve or the filter is fluidly positioned between the pump and the inlet port.

* * * * *